US007840930B2

(12) United States Patent
Furukawa

(10) Patent No.: US 7,840,930 B2
(45) Date of Patent: Nov. 23, 2010

(54) SIGNAL CONNECTION PROGRAM, METHOD, AND DEVICE OF HIERARCHICAL LOGIC CIRCUIT

(75) Inventor: Eiji Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 290 days.

(21) Appl. No.: 12/102,462

(22) Filed: Apr. 14, 2008

(65) Prior Publication Data

US 2008/0222591 A1 Sep. 11, 2008

Related U.S. Application Data

(63) Continuation of application No. PCT/JP2007/050800, filed on Jan. 19, 2007.

(51) Int. Cl.
*G06F 17/50* (2006.01)

(52) U.S. Cl. .............................. 716/12; 716/7

(58) Field of Classification Search ....................... None
See application file for complete search history.

(56) References Cited

U.S. PATENT DOCUMENTS

| 5,528,508 | A | * | 6/1996 | Russell et al. ................... 716/8 |
| 5,790,416 | A | * | 8/1998 | Norton et al. ................. 716/11 |
| 5,901,064 | A | * | 5/1999 | Weber et al. ................... 716/12 |
| 6,028,991 | A | * | 2/2000 | Akashi ......................... 716/14 |
| 6,801,884 | B2 | * | 10/2004 | Ferreri et al. .................. 703/13 |
| 7,062,427 | B2 | * | 6/2006 | Walther et al. ................. 703/22 |
| 7,073,152 | B2 | * | 7/2006 | Keller et al. ................... 716/12 |
| 7,240,316 | B2 | * | 7/2007 | Regnier ........................ 716/11 |

FOREIGN PATENT DOCUMENTS

JP 2002-56041 2/2002

OTHER PUBLICATIONS

International Search Report mailed Feb. 6, 2007 in connection with the International application PCT/JP2007/050800.

* cited by examiner

*Primary Examiner*—Leigh Marie Garbowski
(74) *Attorney, Agent, or Firm*—Staas & Halsey LLP

(57) ABSTRACT

Information of a logic circuit including a hierarchical structure and connection target information up to a connection target including a pin or a net via hierarchies of the logic circuit are read, and a tree structure in which a hierarchy is taken as a node and a connection target is taken as a leaf is produced. The tree structure is referred from its root, and a node from which the tree branches is set to an uppermost node. A leaf the connection target of which is a net is searched from the tree structure, and a hierarchy port or a net in a lower hierarchy is added as a leaf to a lower hierarchy node connected with a net via a hierarchy port. Connection processing is performed to the tree structure from bottom up and the information on the logic circuit is rewritten, and the logic circuit information is outputted.

12 Claims, 32 Drawing Sheets

66
- LEAF — 68
- Node* node — 70
- bool is_net — 72
- Node* net — 74
- PortInfo port — 76

66

```
class Leaf{
  Node* nodes;//POINTER OF NODE WHERE THIS LEAF IS PRESENT
  bool is_net;//TRUE IF THIS LEAF IS NET, FALSE IF THIS LEAF IS PIN OR HIERARCHY PORT
  NetInfo net;//REGION FOR STORING NET INFORMATION WHEN is_net IS TRUE
  PortInfo port;//REGION FOR STORING PIN OR HIERARCHY PORT INFORMATION WHEN is_net IS FALSE
};
```

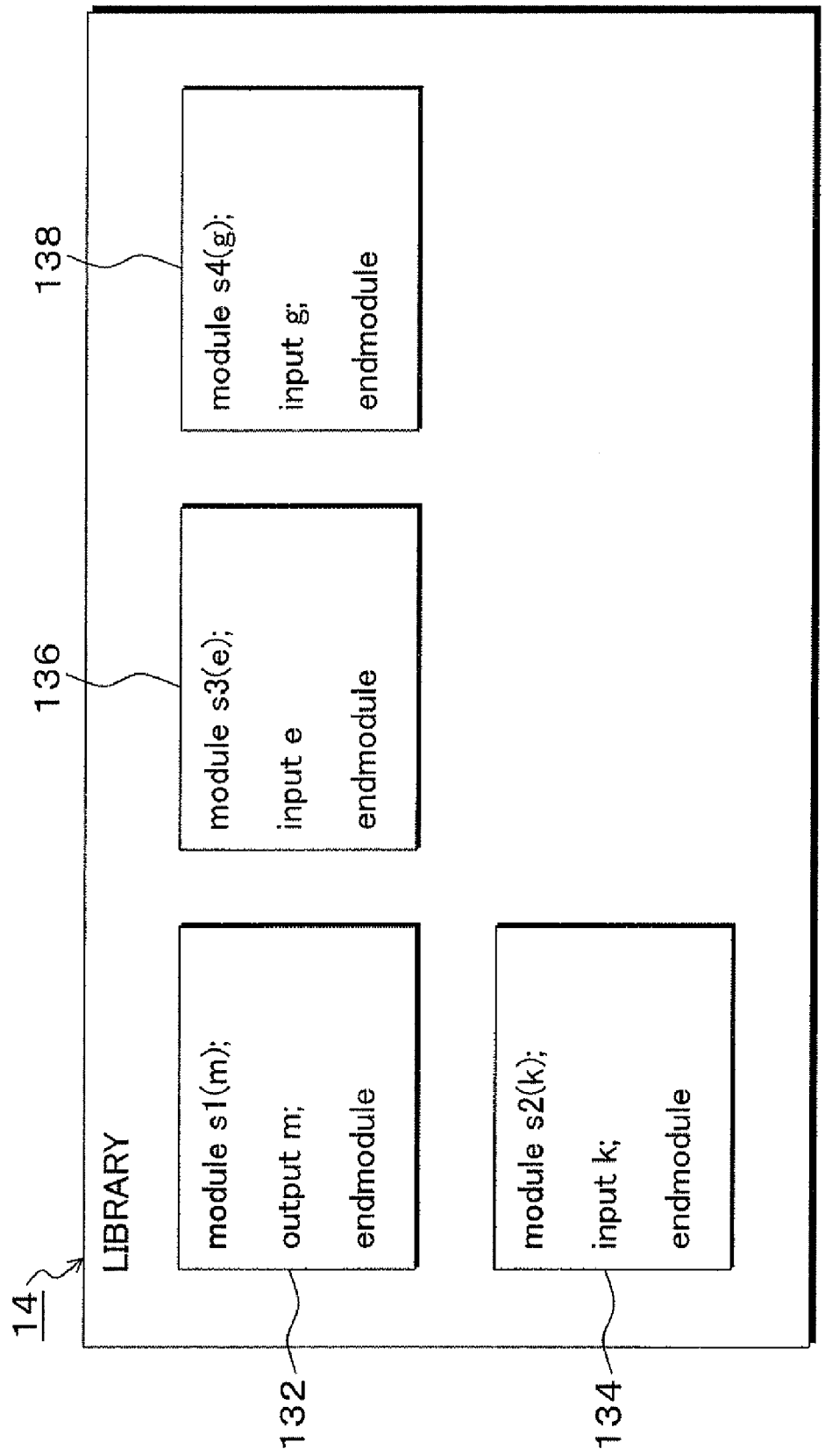

SIGNAL CONNECTION PROGRAM, METHOD, AND DEVICE OF HIERARCHICAL LOGIC CIRCUIT

CROSS REFERENCE TO RELATED APPLICATIONS

This is a continuing application, filed under 35 U.S.C. §111(a), of international Application PCT/JP2007/050800, filed Jan. 19, 2007, it being further noted that foreign priority benefit is based upon international Application PCT/JP2006/300811, filed Jan. 20, 2006, the contents of all of which are incorporated herein by reference.

TECHNICAL FIELD

The present invention relates to signal connection program, method, and device of a hierarchical logic circuit for performing connection in a logic circuit including a hierarchical structure, and in particular, to signal connection program, method, and device of a hierarchical logic circuit for performing signal connection of a net or a pin across a hierarchy.

BACKGROUND ART

Conventionally, design of an LSI circuit is roughly classified into three hierarchies of function design, signal connection of a hierarchical logic circuit, and layout design thereof. The function design produces a circuit of a register transfer level (RTL) from a function to be realized. The signal connection of a hierarchical logic circuit produces a net list of a logic gate from the RTL circuit. The layout design produces a mask pattern from the net list. Generally, in order to perform the signal connection of a hierarchical logic circuit efficiently, a hardware description language (HDL) is used to perform logic synthesis or logic verification. In recent years, an LSI circuit has been increasingly larger. However, when the HDL becomes large, amount of time taken for the logic synthesis or the logic verification increases, and readability of the HDL lowers. Consequently, it has been required to divide the logic circuit by functions to hierarchize the same. The HDL of the hierarchized logic circuit can describe only connection of a signal in a hierarchy. That is, the HDL of the hierarchized logic circuit cannot directly describe connection of a signal outside the hierarchy. Consequently, in order to perform signal connection between hierarchies, a hierarchy port is produced, and the connection is described via the hierarchy port. Conventionally, when the signal connection between hierarchies (connection of a net or a pin) is performed, as shown in FIG. 31, procedures of (1) production of a hierarchy port 300;

(2) connection between a net 302 or a pin in a hierarchy and the hierarchy port 300; and (3) connection between a net 304 or a pin outside a hierarchy and the hierarchy port 300 must be performed.

Patent Literature 1: JP-A-2002-56041

However, in such a conventional method for connecting a signal between hierarchies, the above three procedures of (1) to (3) must be clearly indicated in order to perform connection of a signal between hierarchies. Further, when the hierarchy port is produced, an input/output attribute showing that the hierarchy port is an input port or an output port must be also clearly indicated. Since this procedure is often manually performed, an error may be included. Further, when the above three procedures of (1) to (3) are intended to be simply automated, it can be thought that, when there is a plurality of targets to be connected, a plurality of hierarchy ports are produced. FIG. 32A shows a case in which there are two nets 304, 306 outside a hierarchy with respective to a net 302 in the hierarchy, and in this case, two hierarchy ports 300-1, 300-2 are produced and connected. However, such production of the plurality of hierarchy ports may not be allowed depending on a design rule. In this case, it is desired to produce only one hierarchy port 300 and perform connection, as shown in FIG. 33.

DISCLOSURE OF INVENTION

According to the present invention, there is provided a connection method of a hierarchical logic circuit in which, when connection of a net or a pin across a hierarchy is performed, a proper hierarchy port is automatically produced by providing information on a connection target and connection processing inside and outside the hierarchy is performed.

(Program)

The present invention provides a signal connection program of a hierarchical logic circuit. The signal connection program of a hierarchical logic circuit of the present invention causes a computer to execute:

a logic circuit reading step of reading information on a logic circuit having a hierarchical structure;

a connection target reading step of reading connection target information up to a connection target including a pin or a net via hierarchies of the logic circuit, and producing a tree structure in which a hierarchy is taken as a node and a connection target is a leaf;

an uppermost hierarchy adjusting step of referring to the tree structure from its root, and taking a node from which the tree branches as an uppermost node;

a connection target correcting step of searching a leaf the connection target of which is a net from the tree structure, and adding a hierarchy port or a net in a lower hierarchy as a leaf to a lower hierarchy node connected to the net via the hierarchy port;

a connection processing step of performing a connection processing from bottom up to the tree structure and rewriting the logic circuit information; and a logic circuit outputting step of outputting logic circuit information in which the connection processing has been completed.

The uppermost hierarchy adjusting step takes out a node of the tree structure from its root and sets the node to a processing target, and takes a lower node as a next processing target node when the number of leaves of the processing target node is zero and the number of lower nodes is one, and sets the processing target node to an uppermost node when the number of leaves of the processing target node is one or more or the number of lower nodes is two or more.

The connection target correcting step executes:

a leaf searching step of searching a leaf the connection target of which is taken as a net from the tree structure;

a pin searching step of searching a pin connected to the net; and a leaf adding step of, when the pin has been searched, searching a lower node where an instance of the pin is taken as a hierarchy, and when the lower node has been searched, (1) in the lower hierarchy node, when a hierarchy port corresponding to the pin has not been connected with a net of the lower hierarchy node, adding the hierarchy port as a leaf of the lower hierarchy node, and (2) when a hierarchy port corresponding to the pin has been connected with a net of the lower hierarchy node, adding the net as a leaf of the lower hierarchy node.

The connection processing step executes, when a processing target node is not an uppermost node, a hierarchy port producing step of determining whether or not a leaf of the processing target node is a hierarchy port or whether or not the leaf is connected to a hierarchy port by a net, and when a hierarchy port exists, setting the hierarchy port to a connection target, and when a hierarchy port does not exist, producing a hierarchy port newly;

an input/output attribute setting step of setting an input/output attribute to an output attribute if a driver exists in at least one leaf of the target node, and setting the input/output attribute to an input attribute if a driver does not exist;

a connecting step of connecting a leaf of the target node with the hierarchy port;

a connection correcting step of adding the hierarchy port as a leaf to an upper hierarchy node; and an updating step of deleting the processing target node and setting a next node as a processing target node.

Further, the connection processing step executes, when a processing target node is an uppermost node, a reference net setting step of, if a first processing target leaf is a net, taking the net as a reference net, if a first processing target leaf is a hierarchy port or a pin, setting the hierarchy port or a net connected to a pin as a reference net, and if connection of a net does not exist, producing a net newly and connecting the same to set as a reference net; and a connecting step of connecting processing target leafs subsequent to the first processing target leaf with the reference net.

(Method)

The present invention provides a signal connection method of a hierarchical logic circuit. The signal connection method of a hierarchical logic circuit of the present invention comprises:

a logic circuit reading step of reading information on a logic circuit having a hierarchical structure;

a connection target reading step of reading connection target information up to a connection target including a pin or a net via hierarchies of the logic circuit, and producing a tree structure in which a hierarchy is taken as a node and a connection target is a leaf;

an uppermost hierarchy adjusting step of referring to the tree structure from its root, and setting a node from which the tree branches to an uppermost node;

a connection target correcting step of searching a leaf the connection target of which is a net from the tree structure, and adding a hierarchy port or a net in a lower hierarchy as a leaf to a lower hierarchy node connected to the net via the hierarchy port;

a connection processing step of performing a connection processing from bottom up to the tree structure and rewriting the logic circuit information; and a logic circuit outputting step of outputting logic circuit information in which the connection processing has been completed.

(Device)

The present invention provides a signal connection device of a hierarchical logic circuit. The signal connection device of a hierarchical logic circuit of the present invention comprises;

a logic circuit reading unit which reads information on a logic circuit having a hierarchical structure;

a connection target reading unit which reads connection target information up to a connection target including a pin or a net via hierarchies of the logic circuit, and produces a tree structure in which a hierarchy is taken as a node and a connection target is taken as a leaf;

an uppermost hierarchy adjusting unit which refers to the tree structure from the roots, and sets a node from which the tree branches as an uppermost node;

a connection target correcting unit which searches for a leaf the connection target of which is taken as a net from the tree structure, and adds a hierarchy port or a net in a lower hierarchy as a leaf to a lower hierarchy node connected to the net via the hierarchy port;

a connection processing unit which performs a connection processing to the tree structure and rewrite the logic circuit information; and a logic circuit outputting unit which outputs logic circuit information in which the connection processing has been completed.

According to the present invention, when connection of a net or a pin across a hierarchy is performed with respect to a logic circuit having a hierarchical structure, production or connection of a hierarchy port in the middle can be automatically performed and rewritten by only reading in a hierarchized logic circuit based upon a hardware description language (HDL) to indicate a connection target according to reading of connection target information, so that a hardware description language (HDL) of a hierarchized logic circuit can be outputted.

Further, a hierarchy port automatically produced can be minimized, and a problem caused by a design rule can be eliminated. Further, the input/output attribute of a hierarchy port can be automatically provided.

These automations allow prevention of human error, improvement in convenience of design, reduction of a turn-around time (TAT), and high-quality signal connection of a hierarchical logic circuit.

BRIEF DESCRIPTION OF THE DRAWINGS

FIG. 7 is an explanatory diagram of a library read according to the present embodiment;

BEST MODE FOR CARRYING OUT THE INVENTION

Figure 1:
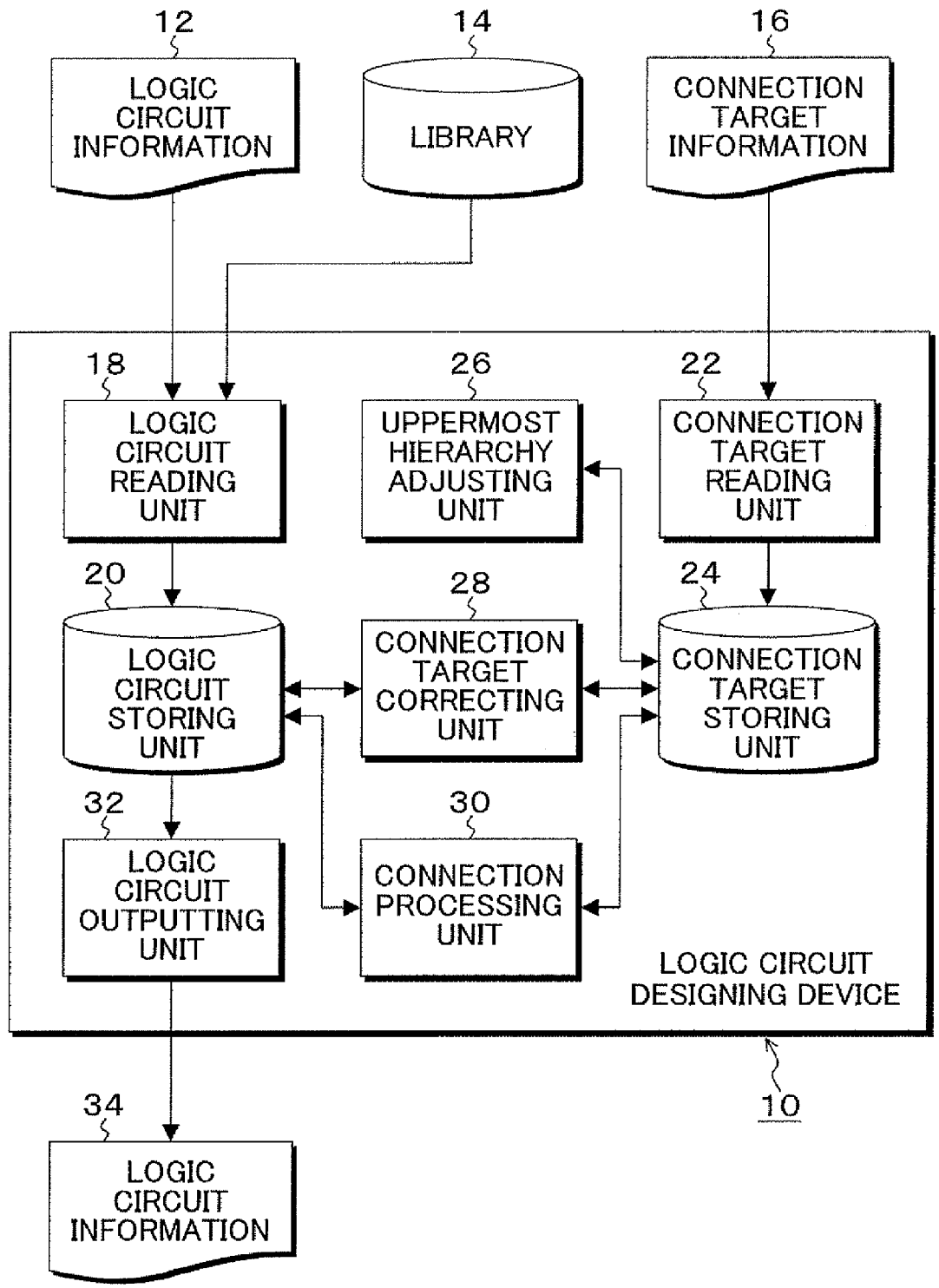
FIG. 1 is a block diagram of a function configuration of a logic circuit designing device according to the present invention.

FIG. 1 is a block diagram of a function configuration of a logic designing device which performs a signal connection processing between hierarchical logic circuits according to the present invention. In FIG. 1, logic circuit information 12 produced by using a hardware description language (HDL), a library 14 storing cells used in a logic circuit, and connection target information 16 for specifying a connection target for connection between hierarchies are prepared for a logic circuit designing device 10, and read therein, respectively. In the logic circuit designing device 10, functions of a logic circuit reading unit 18, a logic circuit storing unit 20, a connection target reading unit 22, a connection target storing unit 24, an uppermost hierarchy adjusting unit 26, a connection target correcting unit 28, a connection processing unit 30, and a logic circuit outputting unit 32 are provided, and logic circuit information 34 in which a connection processing between hierarchies has been completed is outputted. The logic circuit reading unit 18 reads the logic circuit information produced by logic design using the hardware description language (HDL) and stores the same in the logic circuit storing unit 20. Regarding the logic circuit information 12 read by the logic circuit reading unit 18, connection to a net or a pin between hierarchies has not yet been processed, and this signal connection between hierarchies will be performed in the logic circuit designing device 10. Further, the logic circuit reading unit 18 reads cell information used in the logic circuit from the library 14 and stores the same in the logic circuit storing unit 20. The connection target reading unit 22 reads the connection target information 16 up to a connection target including a pin or a net via a hierarchy of the logic circuit to be processed, produces a tree structure in which a hierarchy is taken as a node and a pin or a net to be connected is taken as a leaf, and stores the tree structure in the connection target storing unit 24. The uppermost hierarchy adjusting unit 26 refers to the tree structure stored in the connection target storing unit 24 from its root, and sets a node from which the tree branches as an uppermost node. Since this adjustment of an uppermost node makes it unnecessary to perform a connection processing before the point where the tree branches from the root in the tree structure, the connection processing can be omitted and simplification can be achieved. The connection target correcting unit 28 searches for a leaf the connection target of which is taken as a net from the tree structure stored in the connection target storing unit 24, and performs a connection target correcting processing of adding (1) a hierarchy port, or (2) a net in a lower hierarchy as a leaf to a lower hierarchy node connected with this net via a hierarchy port.

Though the connection target correcting processing will be explained in further detail in a later explanation, when a net and a pin or a net to be connected in a lower node are connected with each other according to the connection target correcting processing, a hierarchy port already existing can be used without producing a new hierarchy port. The connection processing unit 30 performs a connection processing of a pin including a net or a hierarchy port from bottom up to the tree structure of the connection target storing unit 24 in which the uppermost hierarchy adjustment and the connection target correction have been performed, and rewrites the logic circuit information stored in the logic circuit storing unit 20. By this rewriting processing, connection between hierarchies from an upper hierarchy of the logic circuit having a hierarchical structure to a net or a pin to be connected is produced. The logic circuit outputting unit 32 reads out the logic circuit information 34 in which the connection processing has been completed from the logic circuit storing unit 20, and outputs the same outside.

Figure 2:
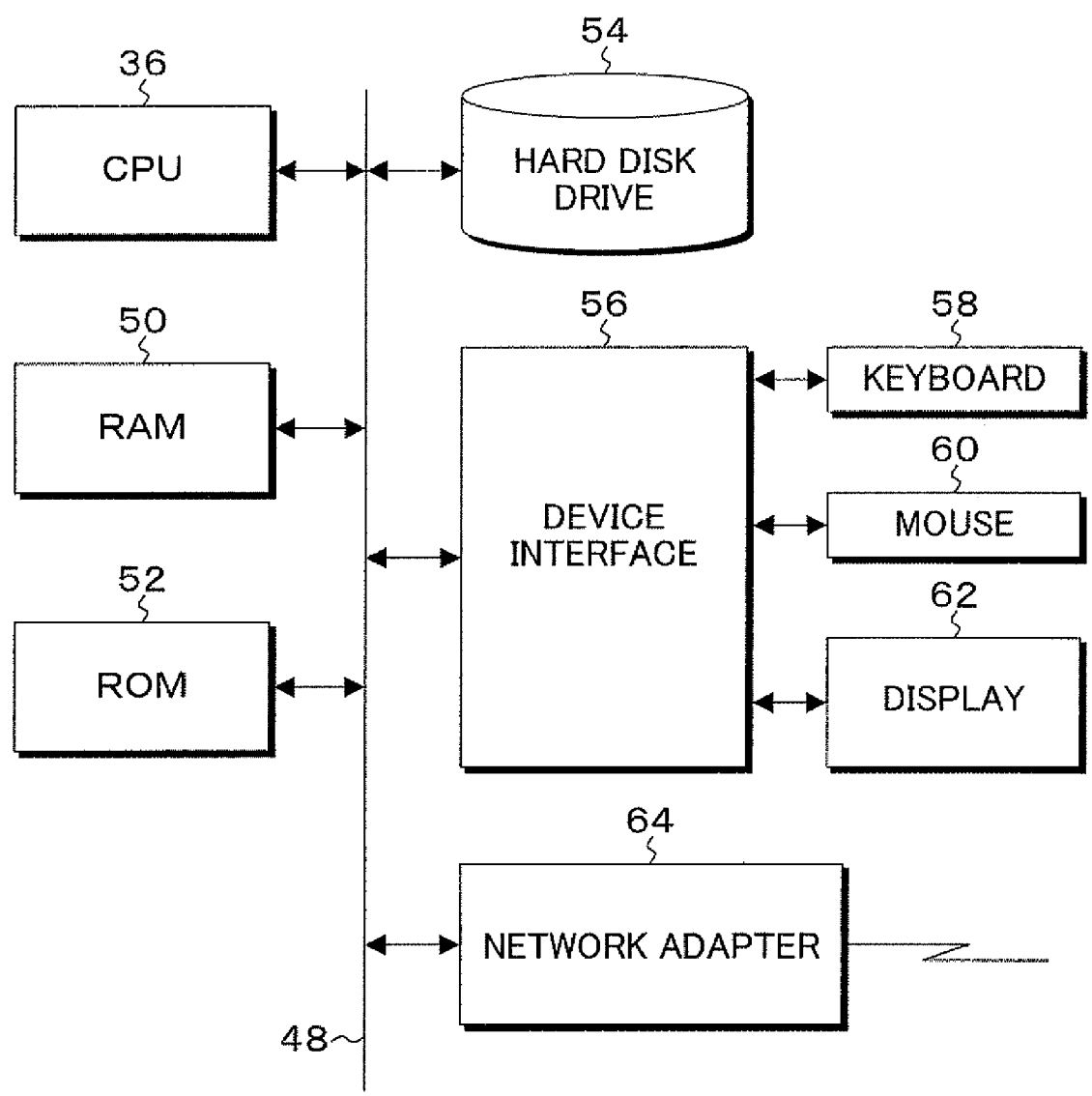
FIG. 2 is a block diagram of a hardware environment of a computer which realizes the function configuration shown in FIG. 1.

FIG. 2 is a block diagram of a hardware environment of a computer which realizes the function of the logic circuit designing device 10 in FIG. 1. In FIG. 2, a RAM 50, a ROM 52, a hard disk drive 54, a device interface 56 for connecting a keyboard 58, a mouse 60, and a display 62, and a network adapter 64 for connecting an external network such as a LAN are provided in a bus 48 of a CPU 36. The signal connection program of a hierarchical logic circuit of the present embodiment is installed in the hard disk drive 54, developed from the hard disk drive 54 to the RAM 50, according to a boot processing performed when the computer is activated by power activation and execution of an application program after OS installation is completed, and performed by the CPU 36.

Figures 3A, 3B:
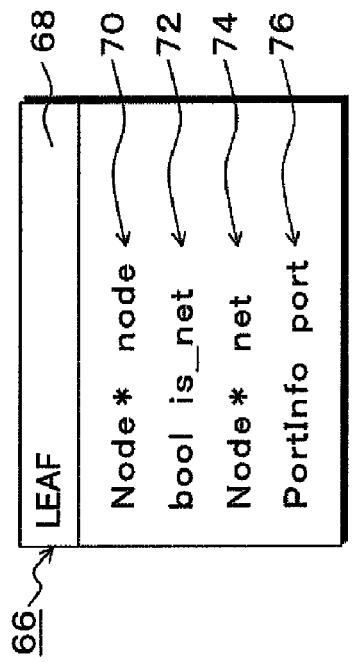
FIGS. 3A and 3B are explanatory diagrams of a data structure of a leaf used in a tree structure according to the present embodiment.

FIGS. 3A and 3B are explanatory diagrams of a data structure of a leaf used for a tree structure of the present embodiment. FIG. 3A is a data structure of a leaf 66, and FIG. 3B explains the content of the leaf 66. FIG. 3A is the data structure of the leaf 66, and the data structure comprises a leaf name 68, a node pointer 70, a leaf type 72, a net information 74, and a port information 76. Referring to contents thereof, as shown in FIG. 3B, the node pointer 70 is a pointer of a node having the leaf 66. The leaf type 72 shows that the leaf 66 is a net, or a pin or a hierarchy port, and stores true if the leaf 66 is a net, and stores false if the leaf 66 is a pin or a hierarchy port. The net information 74 stores information of a net when the leaf type 72 is true, namely, when the leaf 66 is a net. The port information 76 stores information of a pin or a hierarchy port when the leaf type 72 is false, namely, when the leaf type 72 is a pin or a hierarchy port.

Figures 4A, 4B:
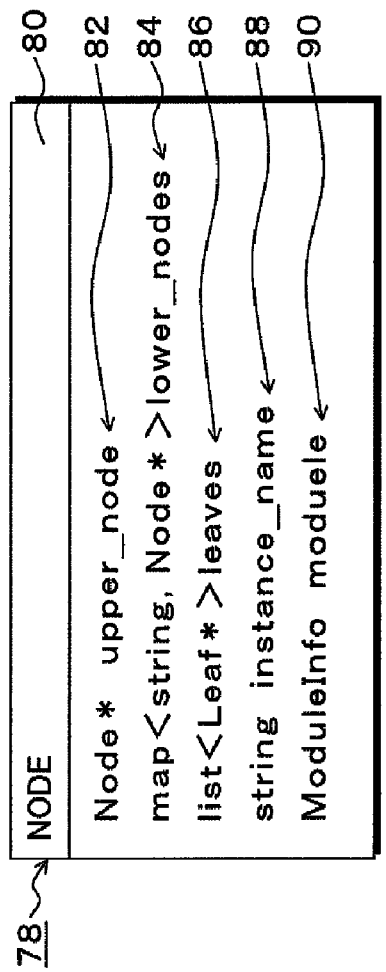
FIGS. 4A and 4B are explanatory diagrams of a data structure of a node used in a tree structure according to the present embodiment.

FIGS. 4A and 4B are explanatory diagrams of a data structure of a node used in the tree structure of the present embodiment. FIG. 4A is a data structure of a node 78, and the data structure comprises a node name 80, an upper node pointer 82, a lower node pointer 84, a leaf pointer 86, an instance name 88, and a node hierarchy information 90. Each content thereof is as shown in FIG. 4B. The upper node pointer 82 is a pointer of an upper node to the node 78. The lower node pointer 82 is a pointer of a lower node of the node 78. The leaf pointer 86 is a pointer of a leaf existing in the node 78. The instance name 88 is an instance name of the node 78. Further, the node hierarchy information 90 is a region storing information on the node 78, namely, a hierarchy therein.

Figure 5:
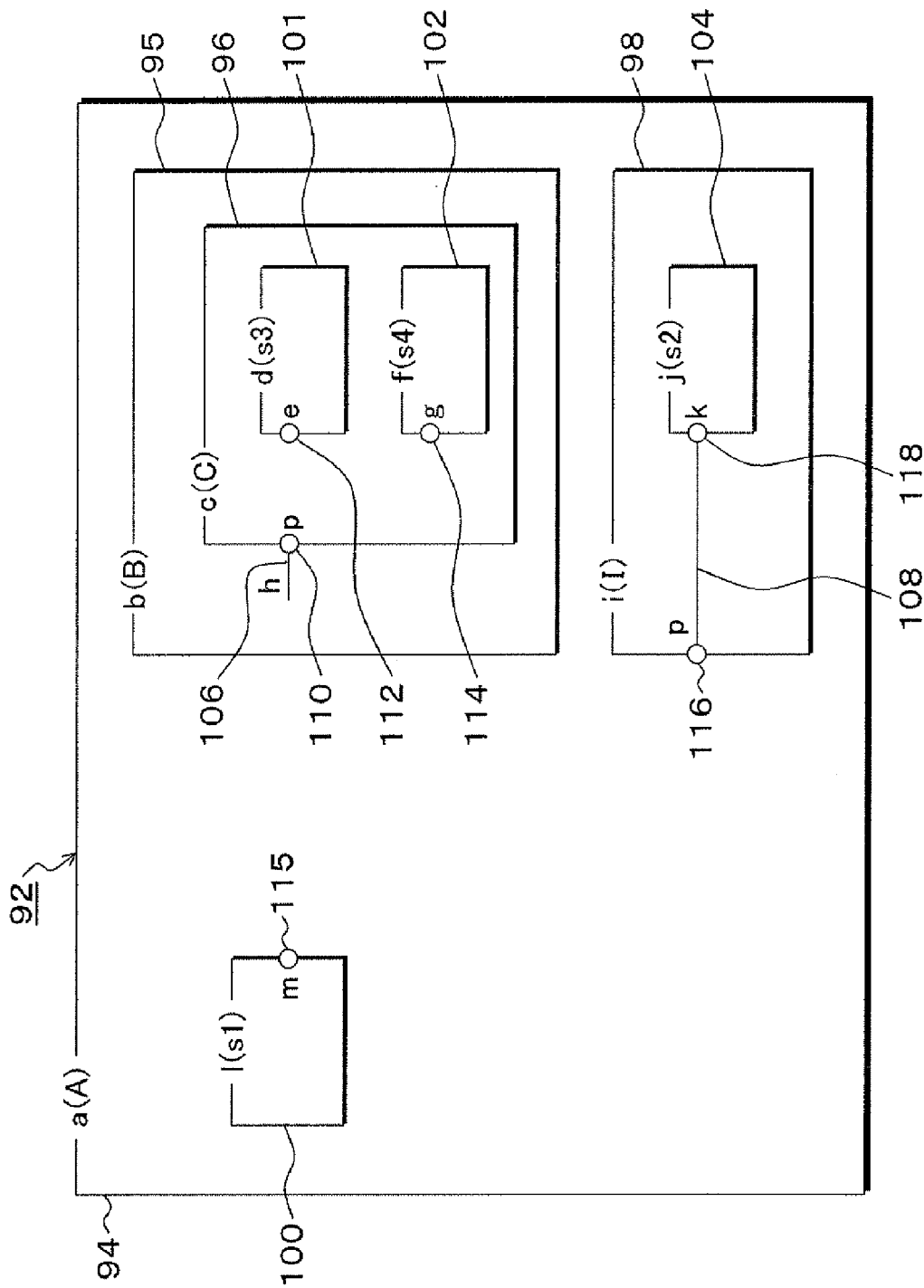
FIG. 5 is a block diagram of a logic circuit read according to the present embodiment.

FIG. 5 is a block diagram showing an example of a logic circuit read in the present embodiment for a signal connection processing between hierarchies. In FIG. 5, the logic circuit 92 includes a hierarchy 94 from the upper side, and next hierarchies 95 and 98 exist in the hierarchy 94. Further, a next hierarchy 96 exists in the hierarchy 95. Here, to take the hierarchy 94 as an example, in an actual processing, the hierarchy 94 is described by hierarchy name(module name)= a(A).

In the logic circuit 92, an instance 100 exists in the hierarchy 94, and instances 101, 102 exist in the hierarchy 96, and further an instance 104 exists in the hierarchy 98. The instances 100, 101, 102, 104 can be obtained from library information of the library 14 in FIG. 1, and are provided as cell information, respectively. For example, to take the instance 100 of the hierarchy 94 as an example, the instance 100 is described by instance name(cell name)=l(s1). As connection targets in the logic circuit 92, pins 110, 112, 114, 115, 116, 118 exist. Further, as connection targets, nets 106, 108 exist. The pins 110, 112, 114, 115, 116, 118 as connection targets are described by symbols "p, e, g, m, p, k" indicating the pins, respectively. Further, the net 106 is described by "h".

Figure 6:
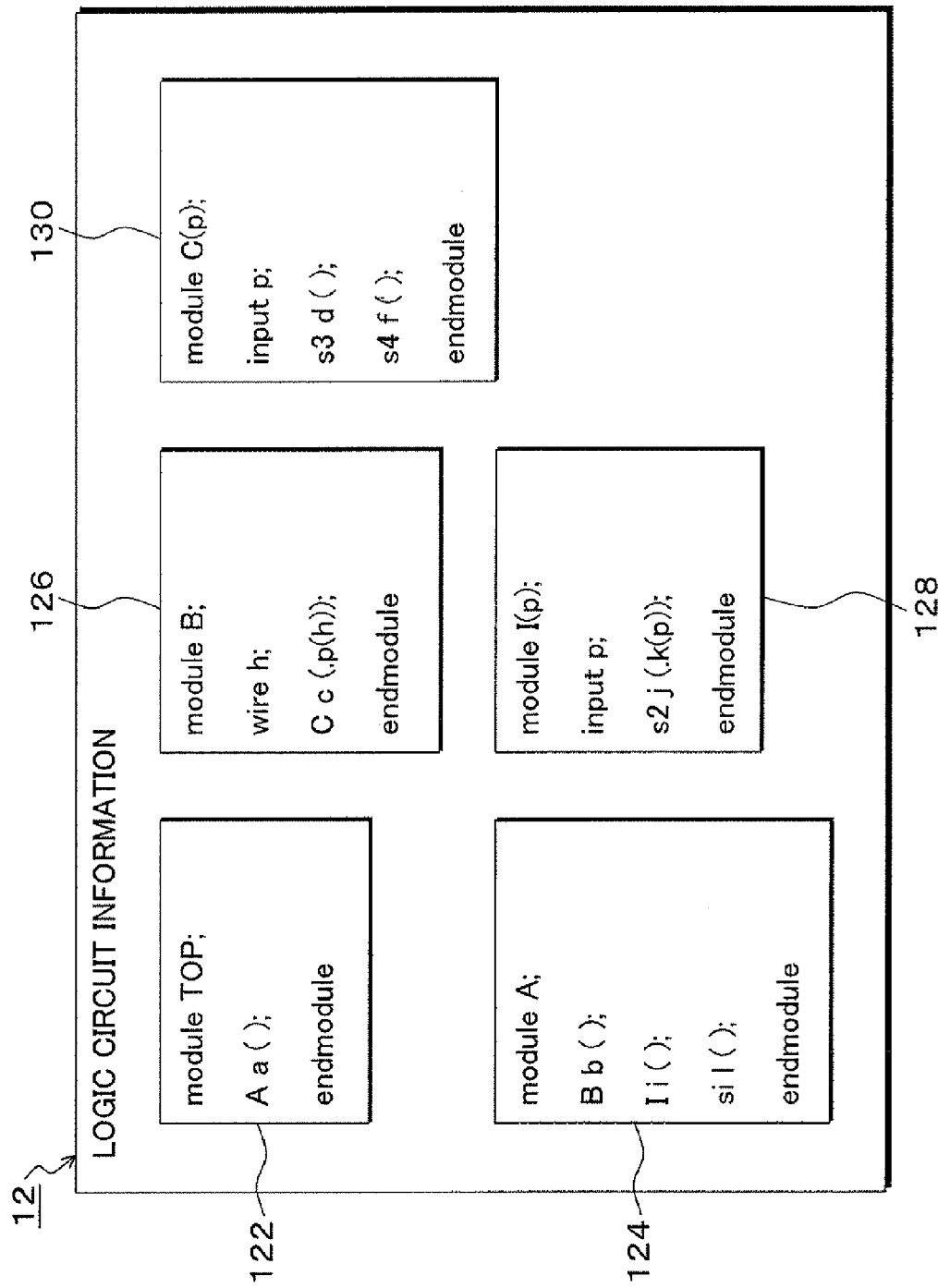
FIG. 6 is an explanatory diagram of logic circuit information corresponding to FIG. 5.

FIG. 6 is an explanatory diagram of logic circuit information corresponding to the logic circuit 92 shown in FIG. 5. In FIG. 6, the logic circuit information 12 comprises module information 122 showing that the hierarchy 94 is the top hierarchy, module information 124 showing contents of the hierarchy 94, module information 126 corresponding to the hierarchy 95, module information 128 corresponding to the hierarchy 98, and module information 130 corresponding to the hierarchy 96.

FIG. 7 is an explanatory diagram of a library 14 corresponding to the logic circuit 92 in FIG. 5 read in the present embodiment. In FIG. 7, cell information 132 corresponding to the instance 100 in FIG. 5, cell information 134 corresponding to the instance 104, cell information 136 corresponding to the instance 101, and cell information 138 corresponding to the instance 102 are provided in the library 14.

Figure 8A:
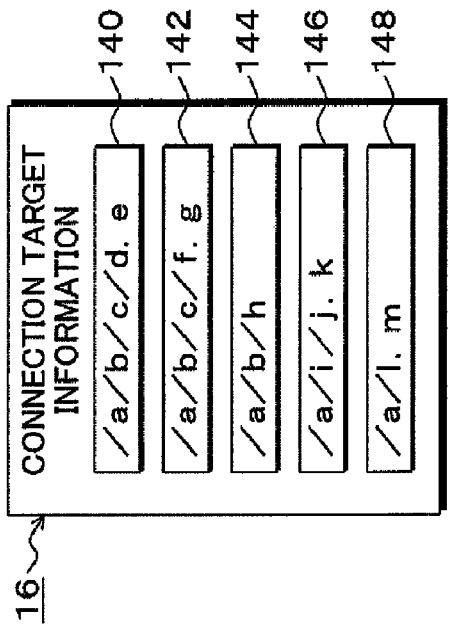
FIGS. 8A to 8C are explanatory diagrams of connection target information read according to the present embodiment.
Figure 8B:
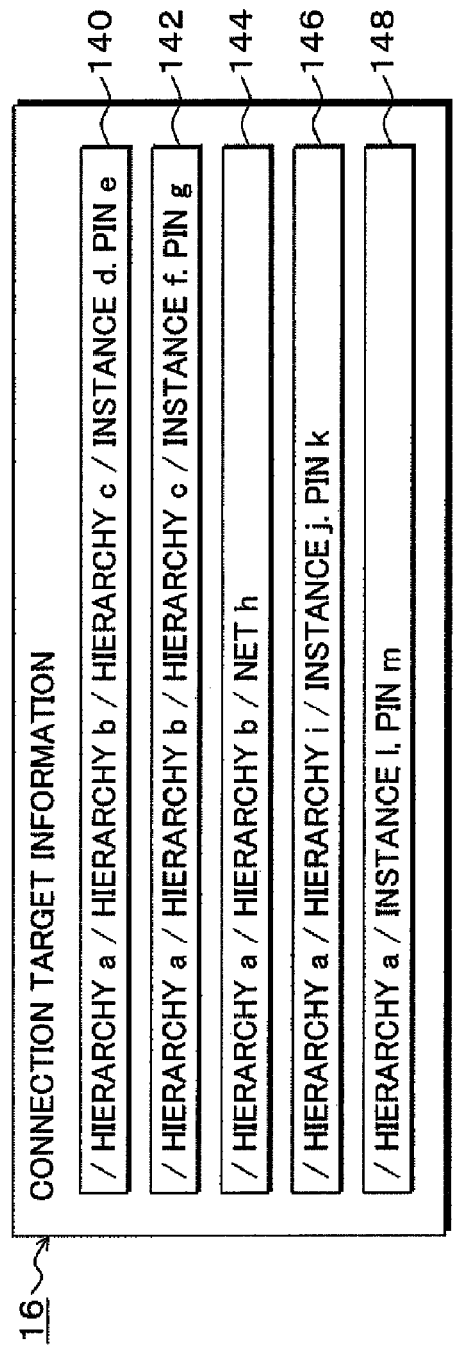
Figure 8C:

FIGS. 8A, 8B, and 8C are explanatory diagrams of connection target information to the logic circuit 92 in FIG. 5 read in the present embodiment. FIG. 8A is connection target information 16, setting connection of a tree structure from a node to a leaf by using the hierarchy names "a, b, c, i", and "d, f, j, l" showing the instances, the pins "e, g, k, m", and further the net "h" which are connection targets. The connection target information constructs a data structure, where, for example, to take connection target information 140 as an example, "/" is used as a separating character, the last element "d. e" is used as a leaf, and each of elements "a, b, c, d" before "d, e" is taken as a node. If ". (period)" is included in the leaf which is the last element, it is shown that the connection target is a pin. In this case, when the last element is "d, e", the instance name "d" is before the period, and the pin name "e" is after the period. The meaning of the connection target information 140 in FIG. 8A is as shown in FIG. 8B. Further, if the instance name before the period is a space, the connection target is a hierarchy port. This is exemplified as connection target information 150 in FIG. 8C, and if the element before the period is a "space", it is shown that the pin behind the period is a hierarchy port. Further, if a period is not included in the leaf which is the last element, the connection target is a net. Connection target information 144 in FIGS. 8A and 8B corresponds to this case, and since a period is not included in the last element thereof, this shows the net "h".

Figure 9:
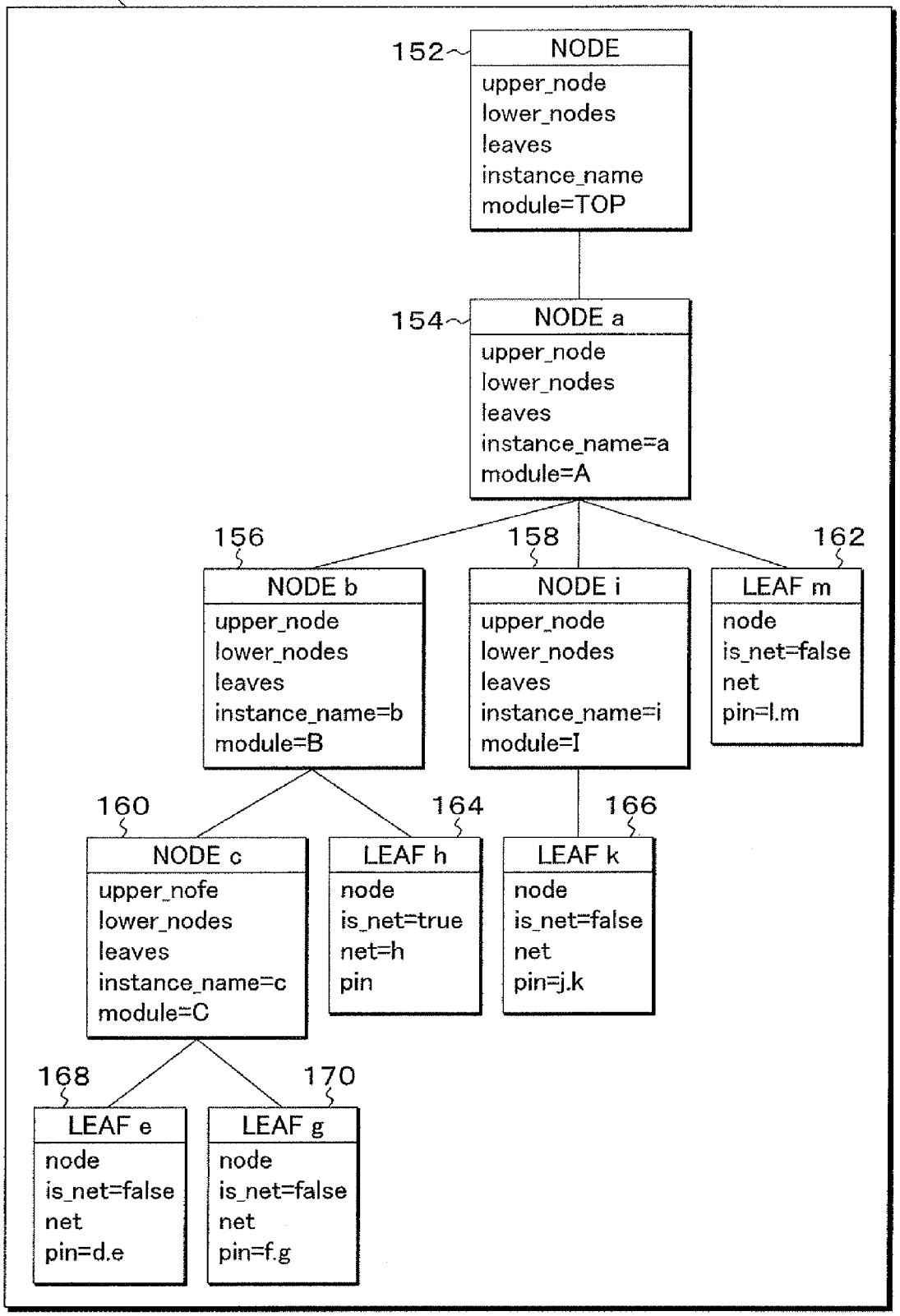
FIG. 9 is an explanatory diagram of a tree structure produced according to the present embodiment.

FIG. 9 is an explanatory diagram of a tree structure 151-1 produced according to the present embodiment to the logic circuit 92 in FIG. 5 based upon the connection target information in FIGS. 8A, 8B, and 8C. In FIG. 9, a node 152 is a top node, and a tree structure beginning at a node 154 under the top node to a leaf 168 via the nodes 154, 156, and 160 according to the connection target information 140 in FIGS. 8A, 8B, and 8C is constructed. Further, according to the connection target information 142 in FIGS. 8A, 8B, and 8C, a tree structure to a leaf 170 via the nodes 154, 156, 160 is constructed. Further, according to the connection target information 144 in FIGS. 8A, 8B and 8C, a tree structure to a leaf 164 via the nodes 154, 156 is constructed. Further, according to the connection target information 146 in FIGS. 8A, 8B, and 8C, a tree structure to a leaf 166 via the node 154 and a node 158 is constructed. Further, according to the connection target information 148 in FIGS. 8A, 8B, and 8C, a tree structure from the node 154 to a leaf 162 via the node 154 is constructed.

Figure 10:
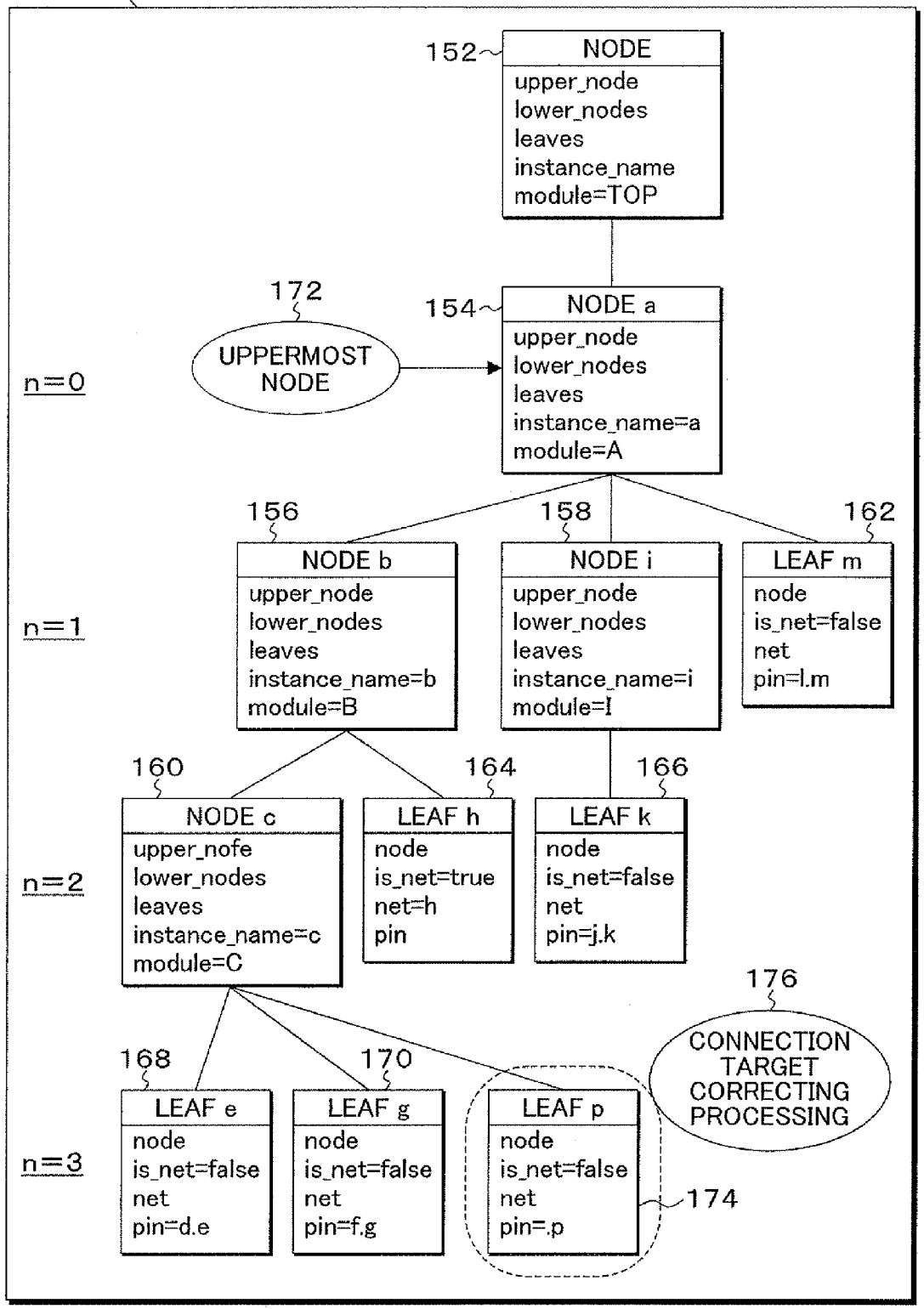
FIG. 10 is an explanatory diagram of a tree structure in which a connection target correcting processing has been performed according to the present embodiment.

Incidentally, with respect to the nodes 154, 156, 158, 160 in FIG. 9, the hierarchy names "a, b, i, c" are described as names of the respective nodes. Further, with respect to the leaves 162, 166, 168, 170, the pin names "m, k, e, g" are described. Further, with respect to the leaf 164, the net name "h" is described. Regarding such a tree structure, an uppermost hierarchy adjustment processing is first performed, and as shown in FIG. 10, the node 154 from which the tree branches becomes an uppermost node 172. Subsequently, a connection target correcting processing is performed. A target to be corrected is a leaf the connection target of which is a net, and since only the leaf 164 targets the net "h" for connection in this tree structure, the leaf 164 is the target to be corrected.

A connection target correcting processing 176 performs the following processing.

(1) Search the leaf 164 the connection target of which is taken as the net "h" from the tree structure.

(2) Search the pin "p" to be connected to the net "h".

(3) If the pin "p" has been searched, search the lower node 160 in the hierarchy "c" using the pin "p" as an instance.

(4) If the node 160 has been searched as a lower node, add the pin "p" which is a hierarchy port as a leaf 174 of the node 160, since the net of the node 160 is not connected to a hierarchy port corresponding to the pin "p" in the node 160 in this case.

Figure 11:
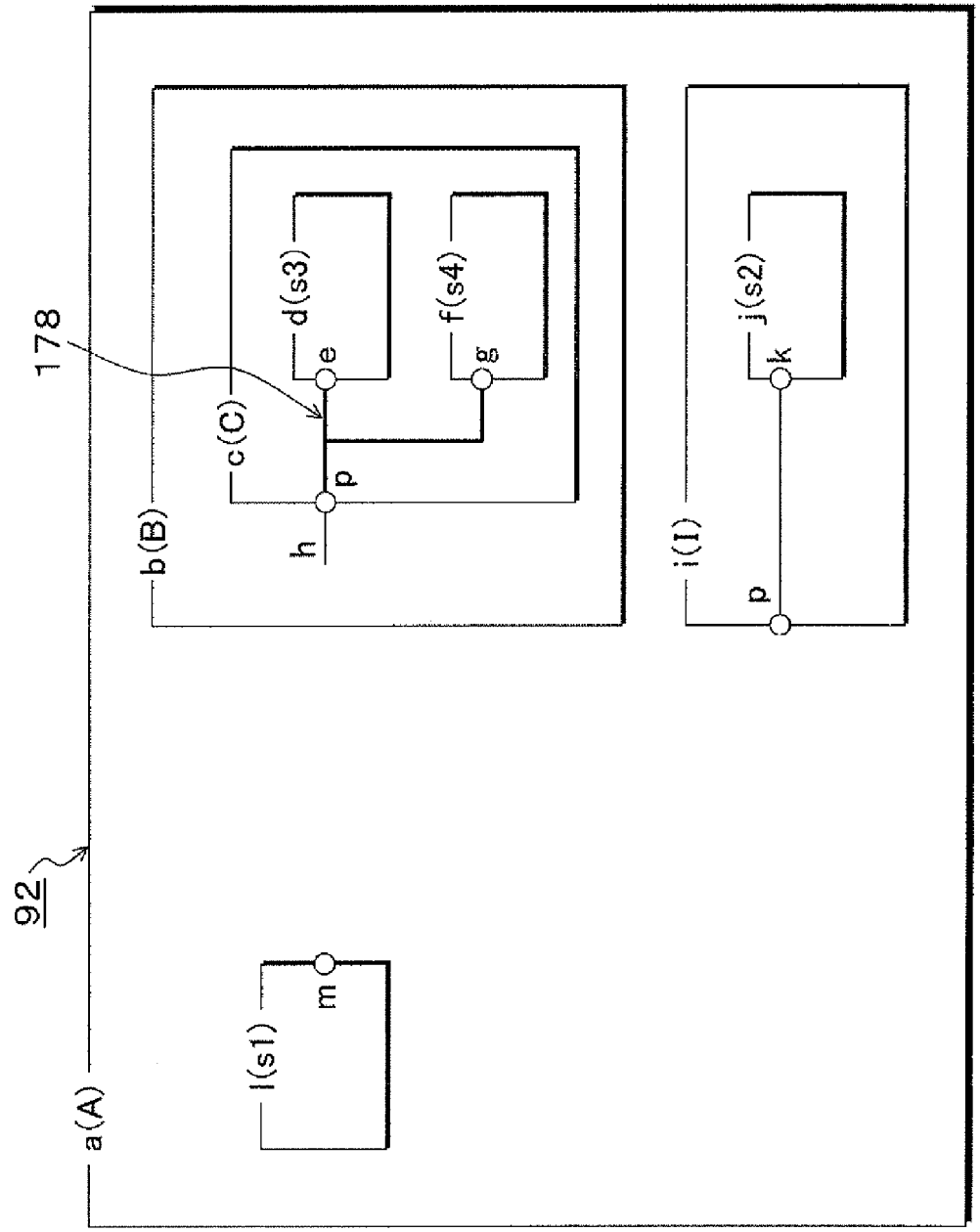
FIG. 11 is a block diagram of a logic circuit corresponding to a connection processing in the tree structure in FIG. 10.
Figure 12:
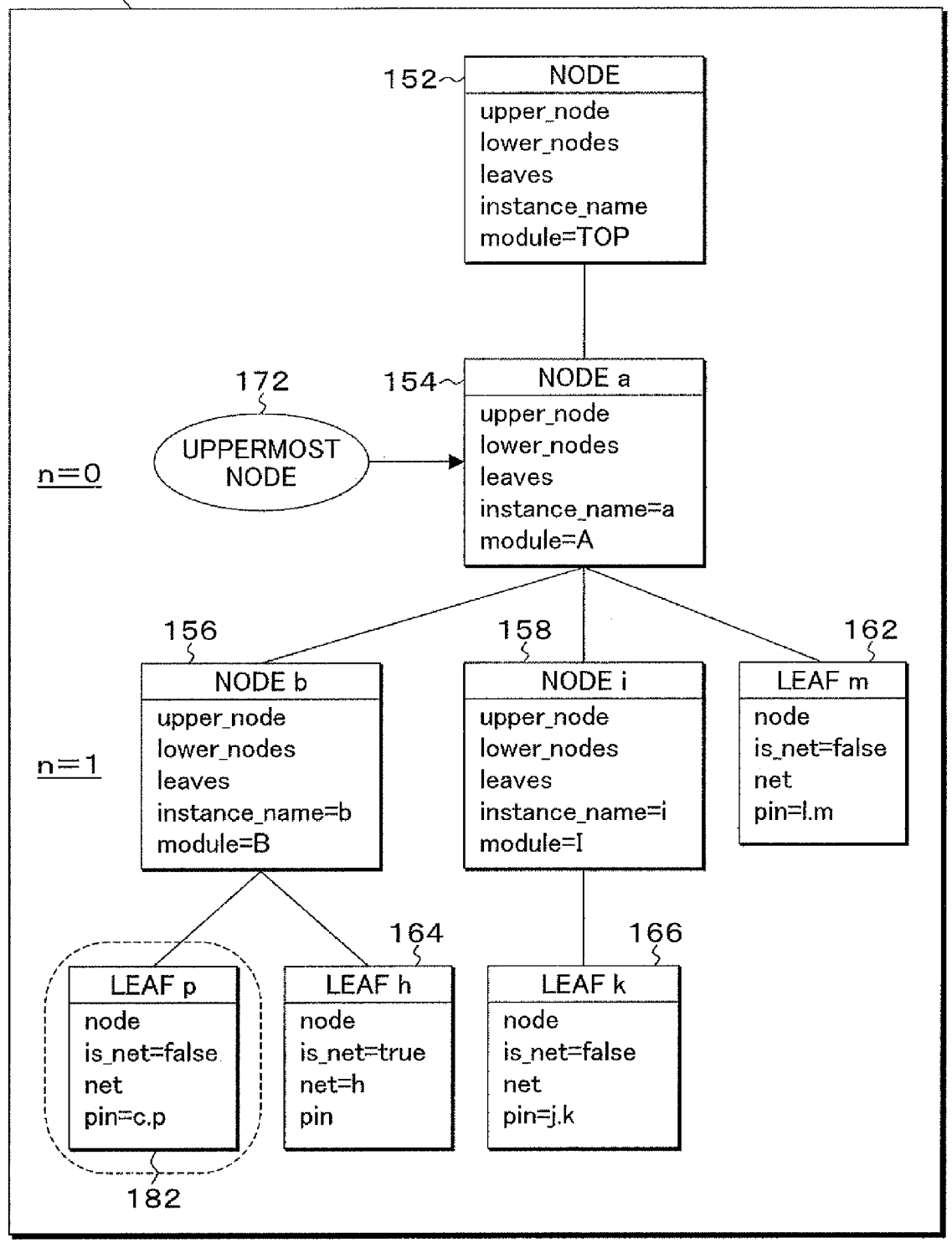
FIG. 12 is an explanatory diagram of the tree structure corresponding to a connection processing subsequent to FIG. 11.

Such addition of the leaf 174 the connection target of which is taken as a hierarchy port "p" by the connection target correcting processing 176 makes it possible to use the hierarchy port added by the correcting processing for the connection processing, without newly producing a hierarchy port. Here, in a tree structure 151-2 in FIG. 10, as a method for searching a leaf having a net to be corrected for connection, a depth-first search or a width-first search, and further, another searching method may be used. Even if any of the leaf searching methods is adopted, the number of targets to be corrected is only one, so that the same result is obtained. After the uppermost hierarchy adjustment processing and the connection target correcting processing are completed in this manner, a connection processing is subsequently performed. The connection processing is performed for each node. As a searching method of a node, the depth-first search or the width-first search, and further, another searching method may be used, but it is required to perform a connection processing from a deepest hierarchy in sequence, namely, from bottom up. In the present embodiment, a connection processing will be explained by taking deepest-first search as an example. In FIG. 10, with respect to the depth of each node, a value n of the node 154 which has been set as the uppermost node 172 is n=0, a value n of a node lower than n=0 is n=1, a value n of a node next to n=1 is n=2, and further a value n of a node under n=2 is n=3, and n=2 and the deepest hierarchy node 160 are first searched as processing targets. Seen the searched node 160 as a processing target, since the node 160 is not an uppermost node, and the hierarchy port "p" exists in the leaf 174 of the leaves 168, 170, 174, the logic circuit information stored is rewritten so that the pin "e" of the leaf 168 and the pin "c" of the leaf 170 are connected to the hierarchy port "p" of the leaf 174. Then, a leaf having the hierarchy port "p" is added to the upper hierarchy node 160, and the node 160 is deleted. The logic circuit 92 in this connection processing is as shown in FIG. 11, and a tree structure thereof is as shown in FIG. 12. That is, in the logic circuit 92 in FIG. 11, the pin "e" and the pin "g" are connected to the hierarchy port "p" by the net 178. Further, in a hierarchical structure in FIG. 12, a tree structure in which a leaf 182 the connection target of which is the hierarchy port "p" has been connected to the node 156 upper than the node 160 which had been the processing target, and the node 160 has been deleted is obtained.

Figure 13:
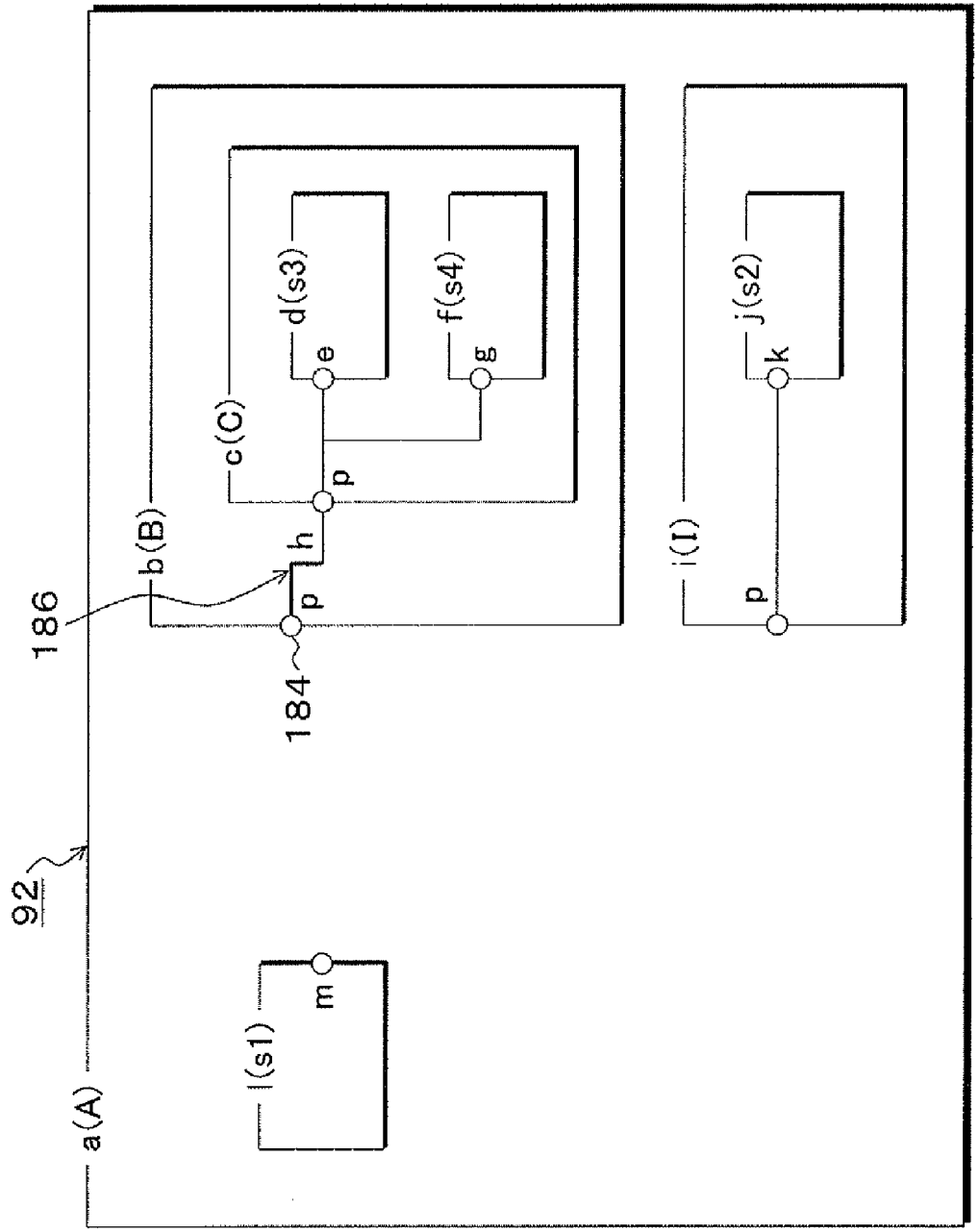
FIG. 13 is a block diagram of a logic circuit corresponding to the connection processing in the tree structure in FIG. 12.

With respect to the tree structure 151-3 in FIG. 12, the node 156 of n=1 becomes a next processing target, and since the node 156 is not uppermost, and a hierarchy port does not exist in the leaf 182 or the leaf 164, a hierarchy port 184 is newly produced, as shown in the logic circuit 92 in FIG. 13, and an input/output attribute of the hierarchy port 184 is taken as an input attribute because a driver does not exist in this case, and the logic circuit information stored is rewritten so that the pin "p" of the leaf 182 and the net "h" of the leaf 164 in FIG. 12 are connected by the net 186 to the hierarchy port 184 newly produced.

Figure 14:
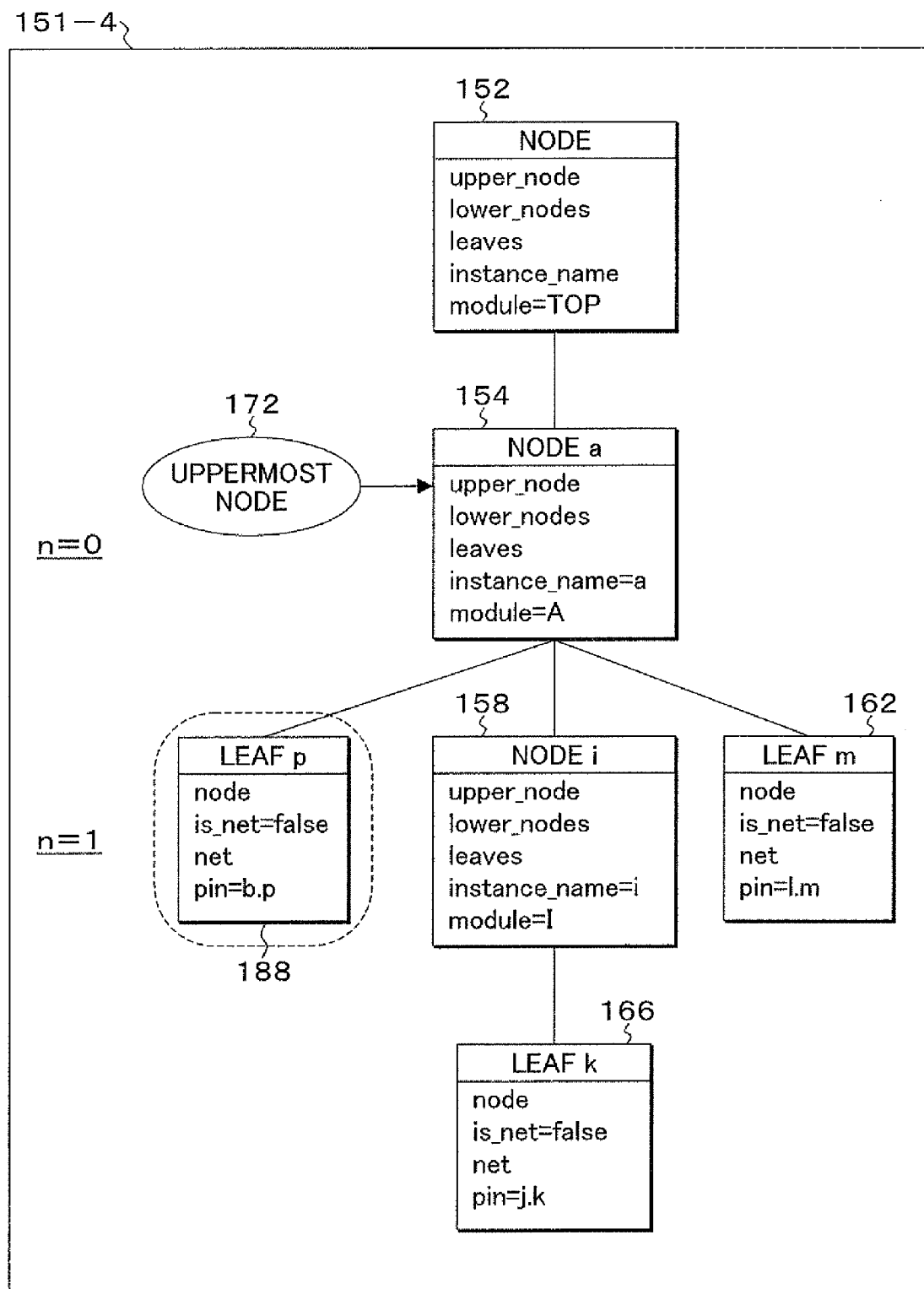
FIG. 14 is an explanatory diagram of a tree structure corresponding to a connection processing subsequent to FIG. 13.

Further, the hierarchy port "p" is added to the upper hierarchy node "a" as a leaf of a pin, and the node 156 being currently a processing target is deleted. The tree structure according to this processing is as shown in FIG. 14. In FIG. 14, the node 156 which is a processing target in FIG. 12 has been deleted, and a leaf 188 in which the hierarchy port 184 newly produced is the pin "p" has been added to the upper node 154.

Figure 15:
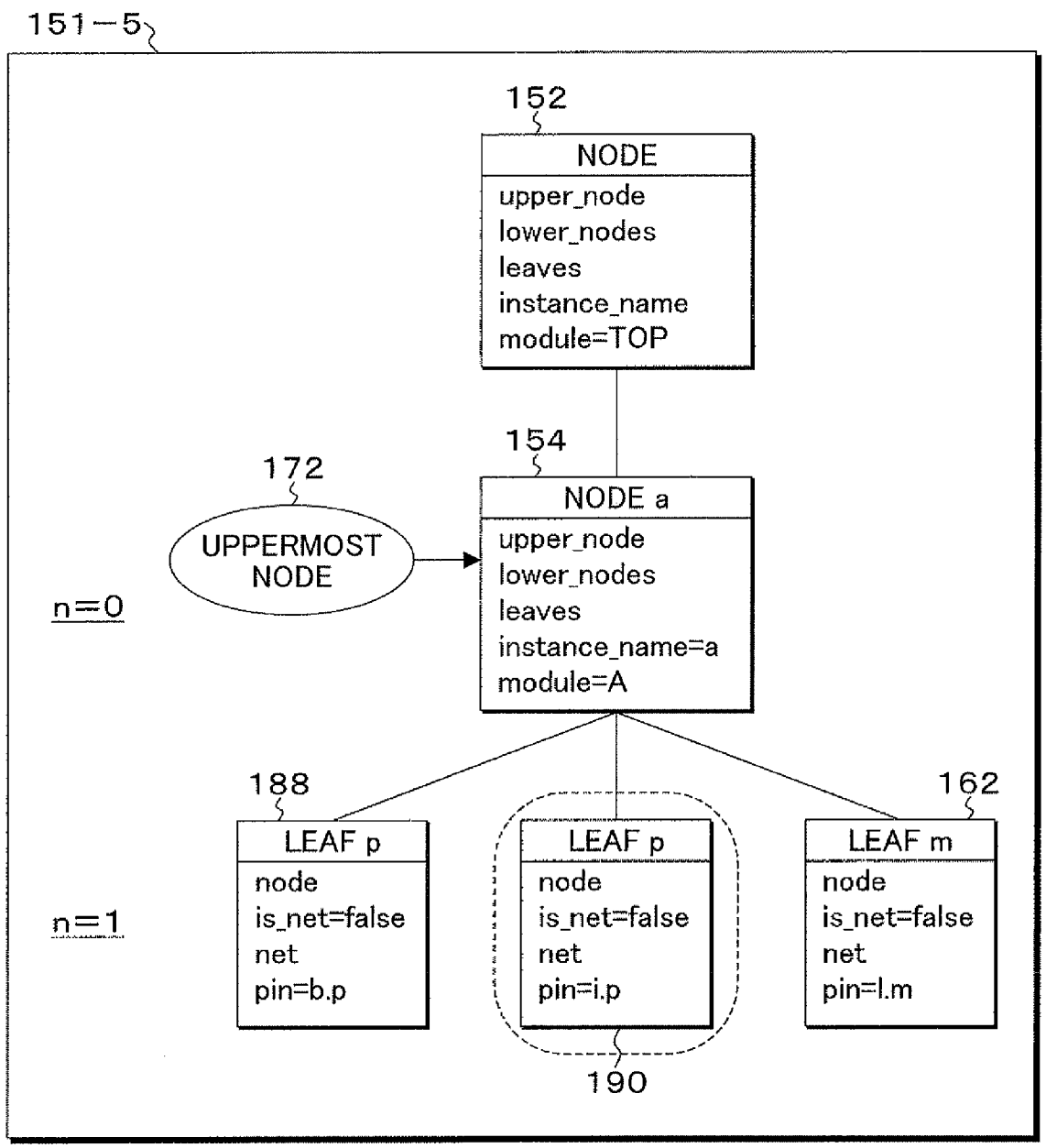
FIG. 15 an explanatory diagram of a tree structure corresponding to a connection processing of an uppermost node subsequent to FIG. 14.

Subsequently, in a tree structure 151-4 in FIG. 14, since the node 158 is a processing target, the node 158 is not uppermost, a hierarchy port 116 is preliminarily connected to the pin "k" of the leaf 166 of the node 158, as is apparent from the logic circuit 92 in FIG. 13, and the hierarchy port already exists, a hierarchy port is not newly produced. Subsequently, the pin "p" which is a hierarchy port is added as a leaf to the upper hierarchy node 154, and the node 158 is deleted. As a result of this connection processing, a tree structure 151-5 in FIG. 15 is obtained. That is, the node 158 which is a processing target in FIG. 14 has been deleted, and a leaf 190 of the pin "p" which is a hierarchy port has been newly added to the upper node 154.

Figure 16:
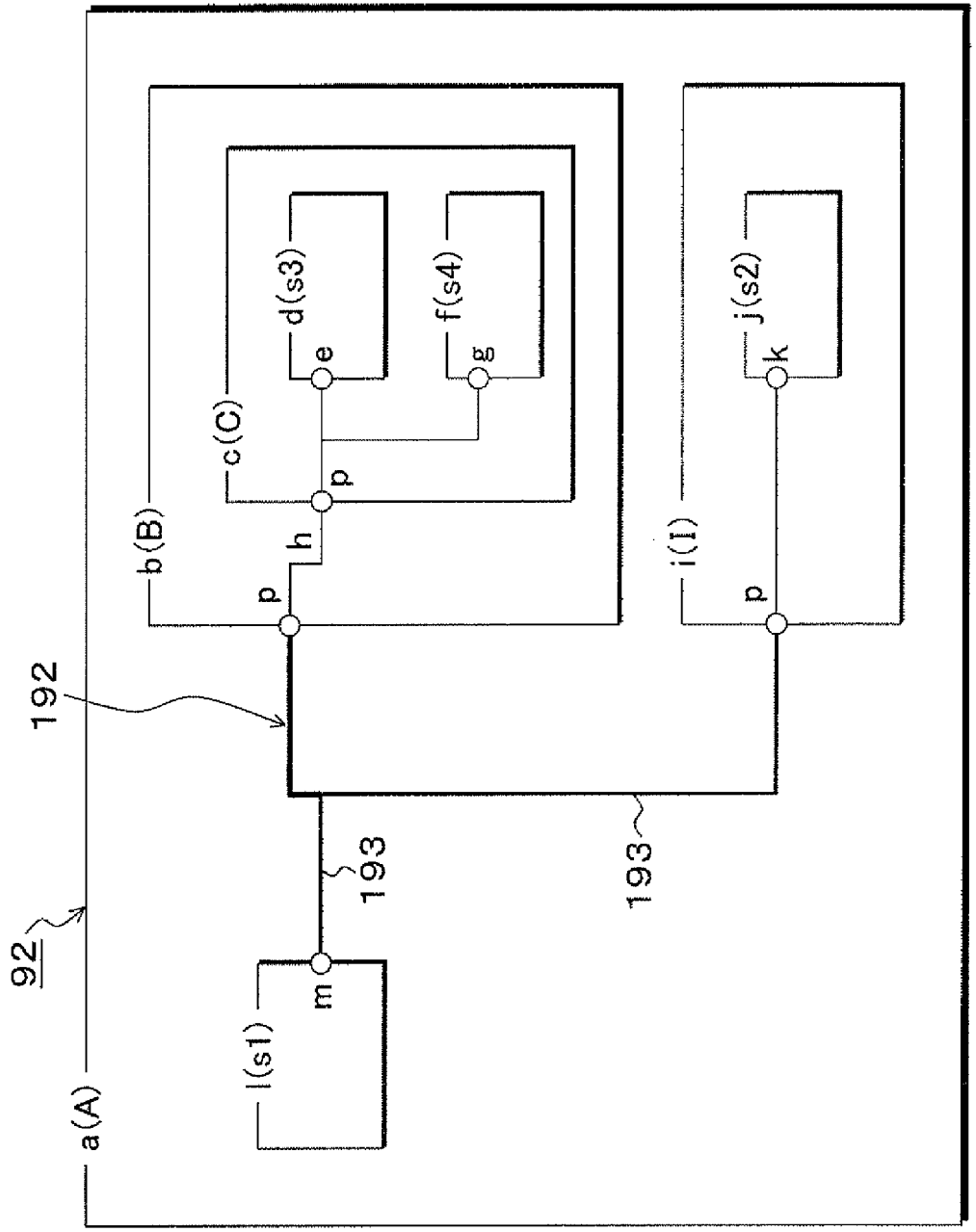
FIG. 16 is a block diagram of a logic circuit corresponding to the connection processing in the tree structure in FIG. 15.

Subsequently, with respect to the tree structure 151-5 in FIG. 15, the node 154 of n=0 is a target for a connection processing. Here, since the node 154 is the uppermost node 172, attention is focused on the leaf 188 which is one of a plurality of leaves 188, 190, 162, and since the connection target of the leaf 188 is not a net but the pin "p", a net 192 is newly produced as shown in the logic circuit 92 in FIG. 16, and the net 192 is set as a reference net "n". Next, with respect to the second and subsequent leaves 190, 162, the logic circuit information stored is rewritten so that the pin "p" of the leaf 190 and the pin "m" of the leaf 162 are connected to the reference net "n". As a result, as shown in the logic circuit 92 in FIG. 16, a connection processing between the pin and the net which are connection targets between hierarchies according to the connection target information 16 in FIGS. 8A to 8C is terminated.

Figure 17:
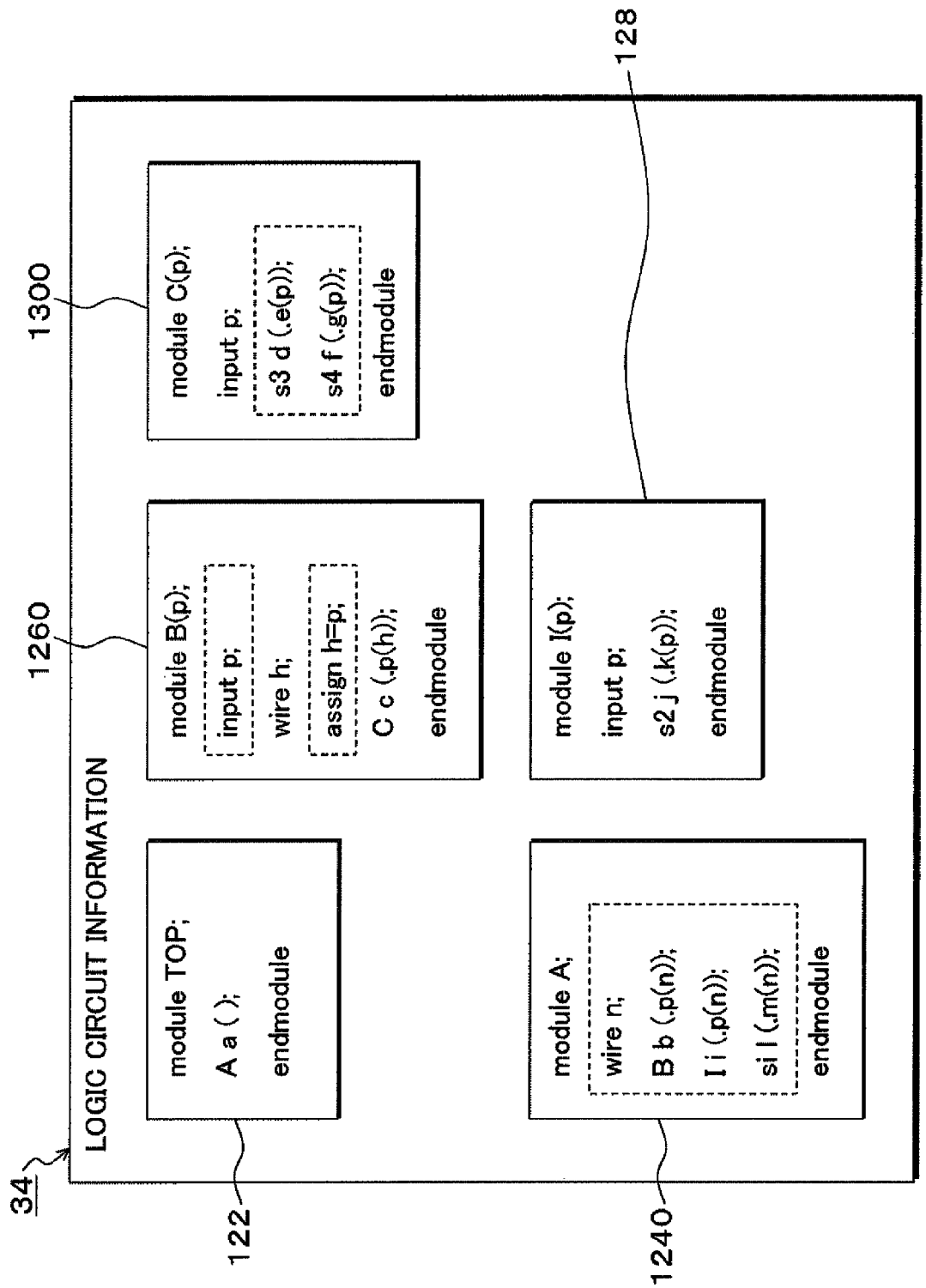
FIG. 17 is an explanatory diagram of logic circuit information rewritten and outputted by a connection processing of the present embodiment.

When the connection processing based upon the tree structure has been terminated, the logic circuit information which has been rewritten is finally outputted, and logic circuit information 34 which has been rewritten is as shown in FIG. 17. Regarding the rewritten logic circuit information 34 in FIG. 17, the module information 122 and the module information 128 of the logic circuit information 12 read for the connection processing shown in FIG. 6 have been left as they are, but the remaining module information configures logic circuit information where rewriting of parts of module information 1240, 1260, 1300 surrounded by broken lines has been performed and the connection of a signal between hierarchies to a net or a pin has been completed.

Figure 18:
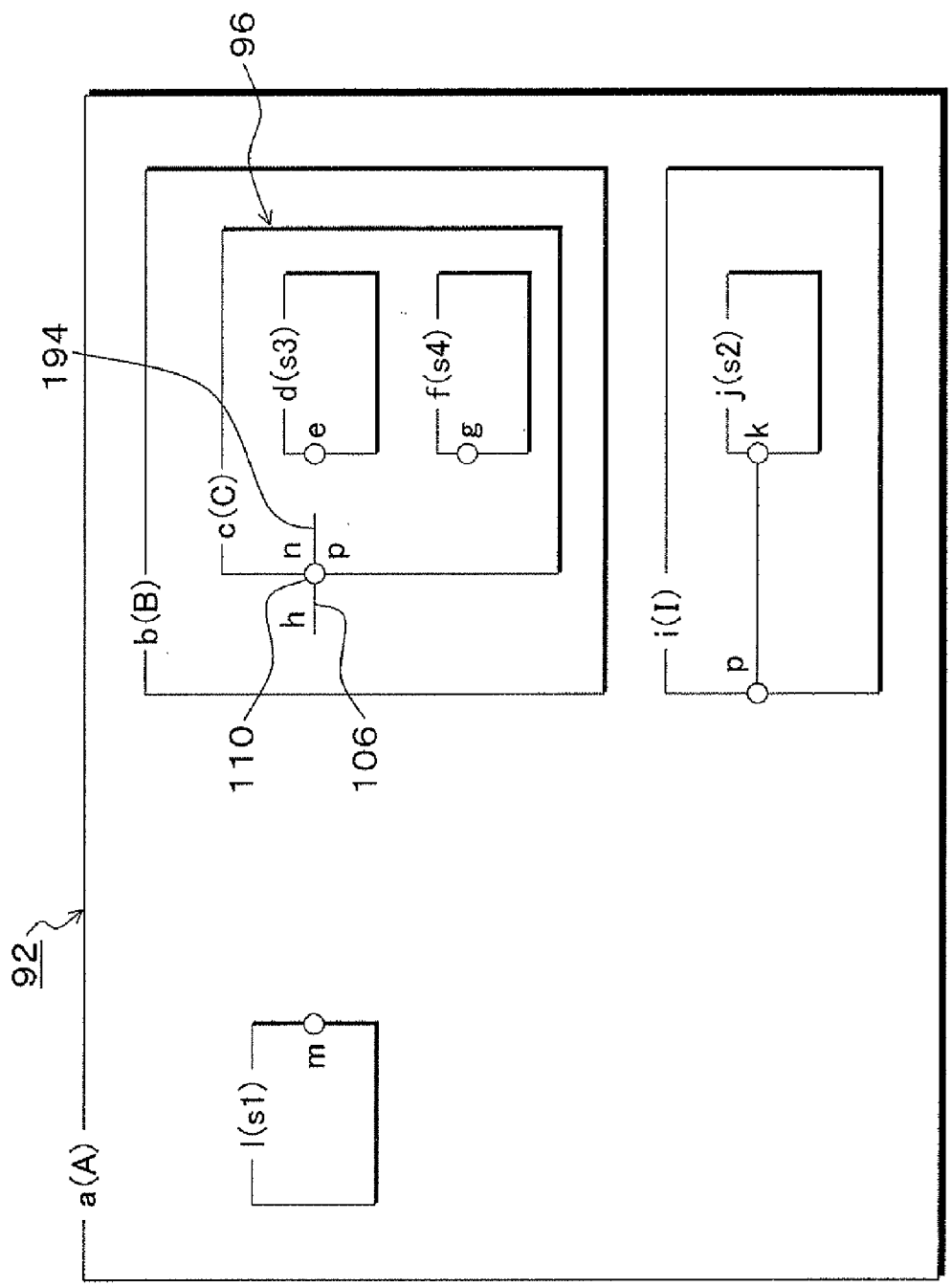
FIG. 18 is a block diagram of a logic circuit which is another processing configuration of the connection target correcting processing in the present embodiment.

FIG. 18 is a block diagram of a logic circuit which is another processing configuration of the present connection target correcting processing in the embodiment. In the logic circuit 92 in FIG. 18, though the net 106 is connected to the pin 110 which is a hierarchy port of the hierarchy 96 in the logic circuit 92 in FIG. 5, but in the logic circuit 92 in FIG. 18, a net 194 in a hierarchy node of the pin 110 which is a hierarchy port is further connected to the hierarchy port 110.

Figure 19:
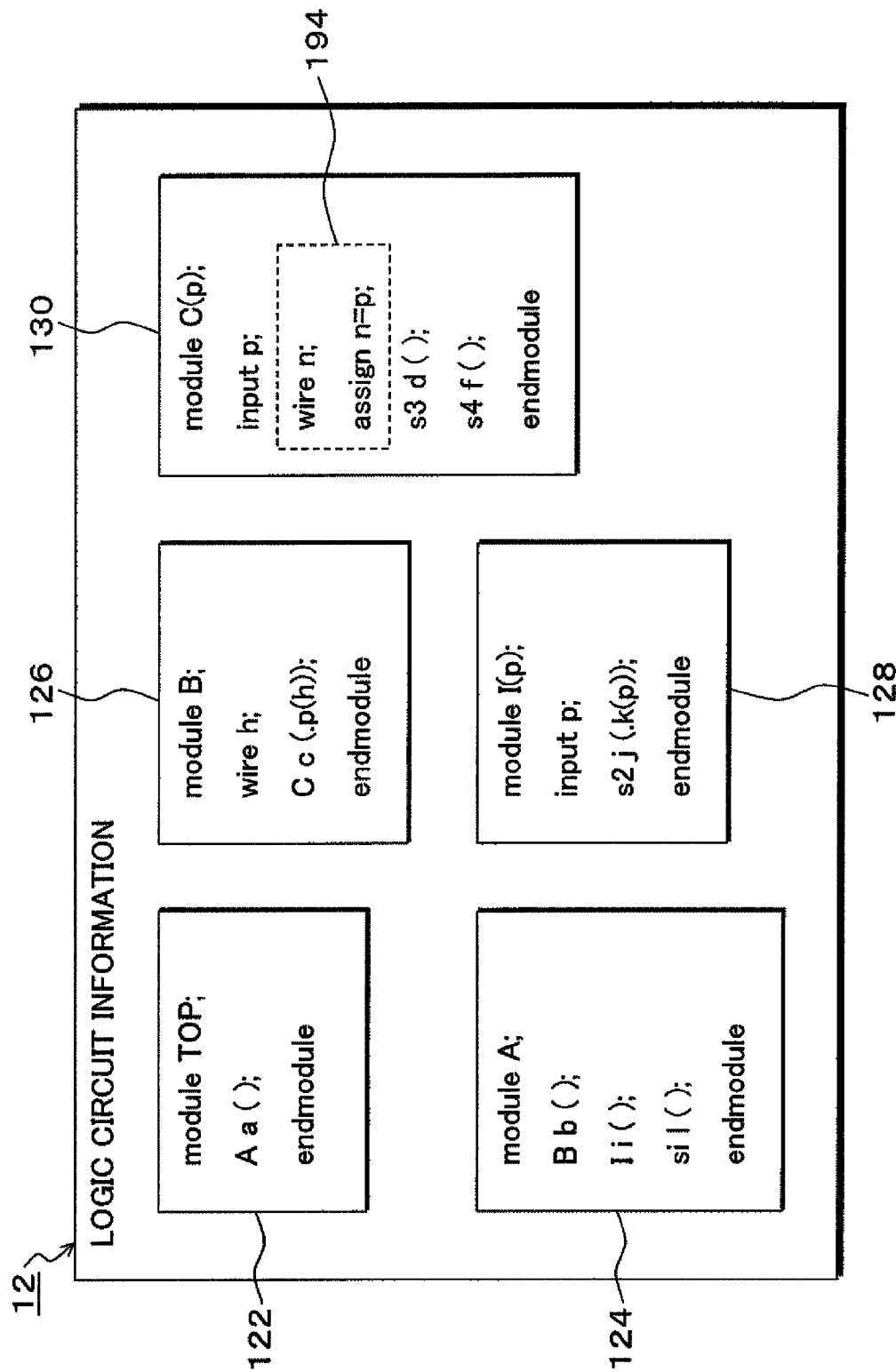
FIG. 19 is an explanatory diagram of logic circuit information corresponding to the logic circuit in FIG. 18.

FIG. 19 is logic circuit information 12 corresponding to the logic circuit 92 in FIG. 18, where information that the net 194 is connected to the pin p serving as a hierarchy port has been added to a portion of the module information 130 corresponding to the hierarchy 96, surrounded by a broken line 194.

Figure 20:
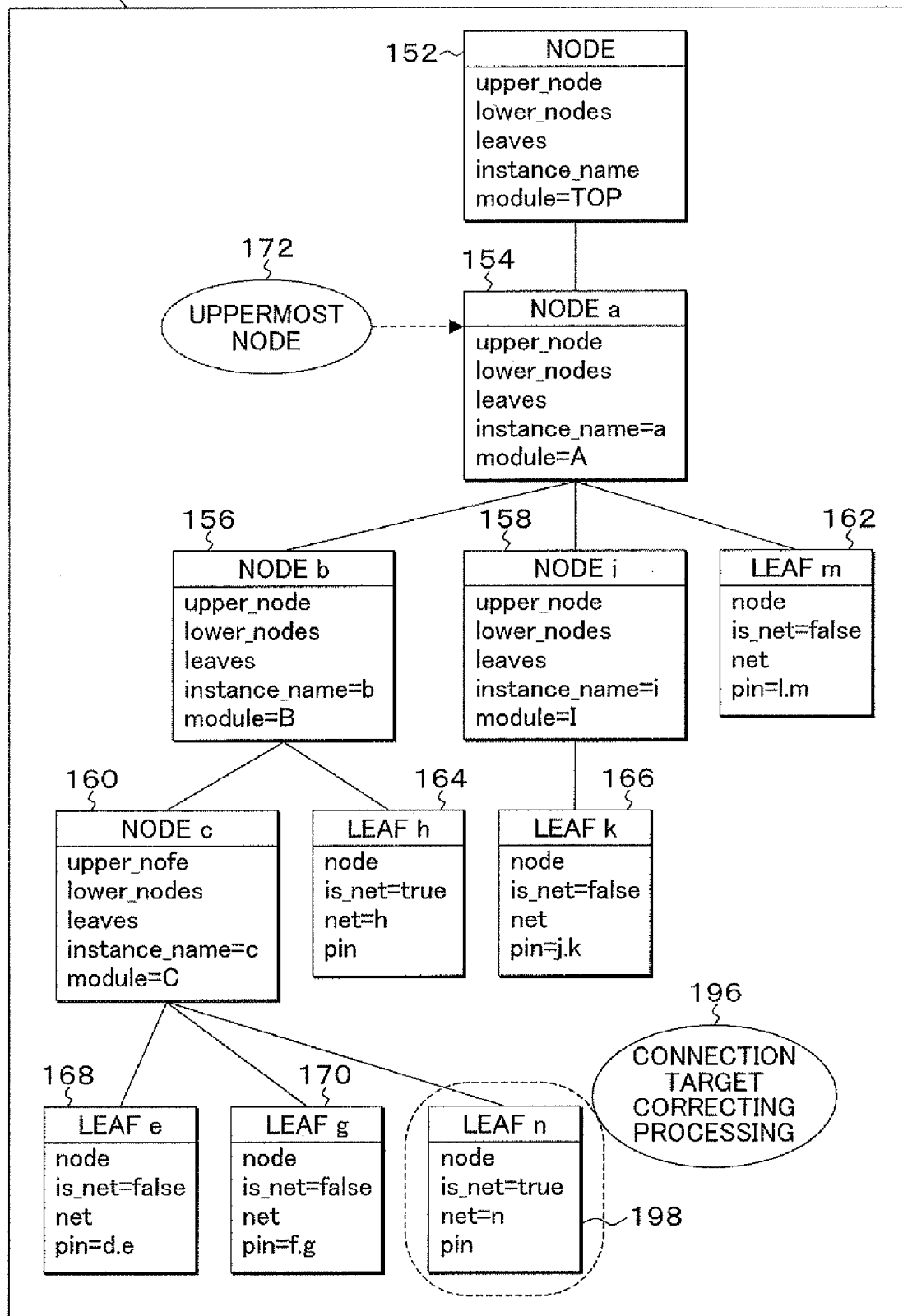
FIG. 20 is an explanatory diagram of a tree structure produced based upon the logic circuit in FIG. 18 and the connection target correcting processing.

FIG. 20 is a tree structure 151-6 based upon connection information of the logic circuit 92 in FIG. 18, and the tree structure before a correction target processing is the same as that in FIG. 9, but a leaf 198 of the net "n" has been added to the node 160 by a connection target correcting processing 196 targeting the leaf 164 having the net "h". A processing procedure of this connection target correcting processing 160 is as follows.

(1) Search the leaf 164 the connection target of which is the net "h" from the tree structure.

(2) Search the pin "p" to be connected to the net "h".

(3) When the pin "p" has been searched, search the lower node 160 the hierarchy of which is the instance of the pin "p".

(4) When the lower node 160 has been searched, if the net "n" of the lower node 160 has been connected to a hierarchy port corresponding to the pin "p", add the net "n" as a leaf 198 of the lower node 160.

Figure 21:
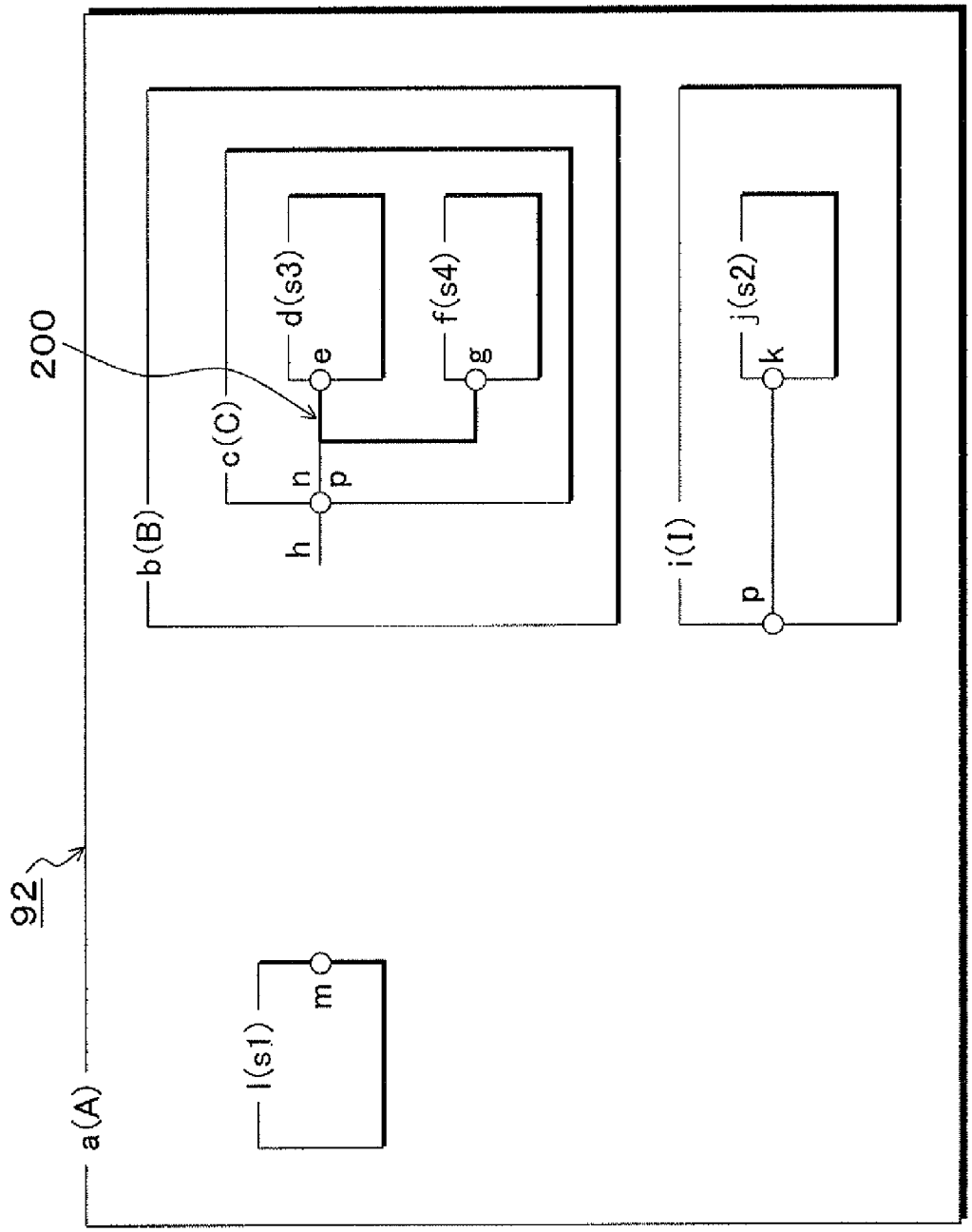
FIG. 21 is a block diagram of a logic circuit corresponding to the connection target correction in FIG. 20.
Figure 22:
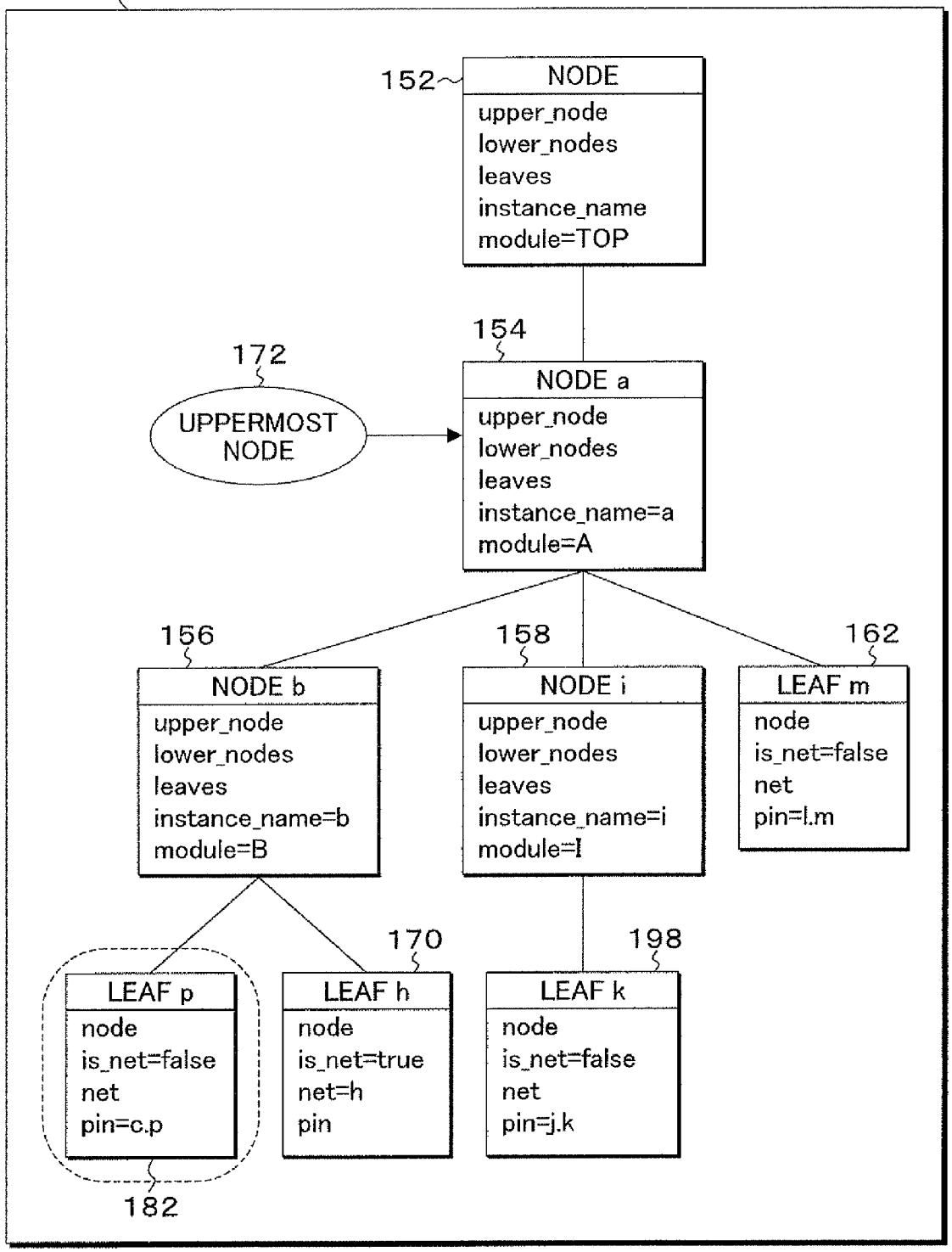
FIG. 22 is an explanatory diagram of a tree structure corresponding to a connection processing subsequent to FIG. 21.

The logic circuit 92 in this connection processing is as shown in FIG. 21. A connection processing subsequent to the connection target correcting processing in FIG. 20 is the same as that in the case of the logic circuit 92 in FIG. 5, and rewriting of logic circuit information having a tree structure 151-7 shown in FIG. 22 is performed by a first connection processing to the node 160, which results in the same tree structure as the tree structure 151-3 in FIG. 12.

Figure 23:
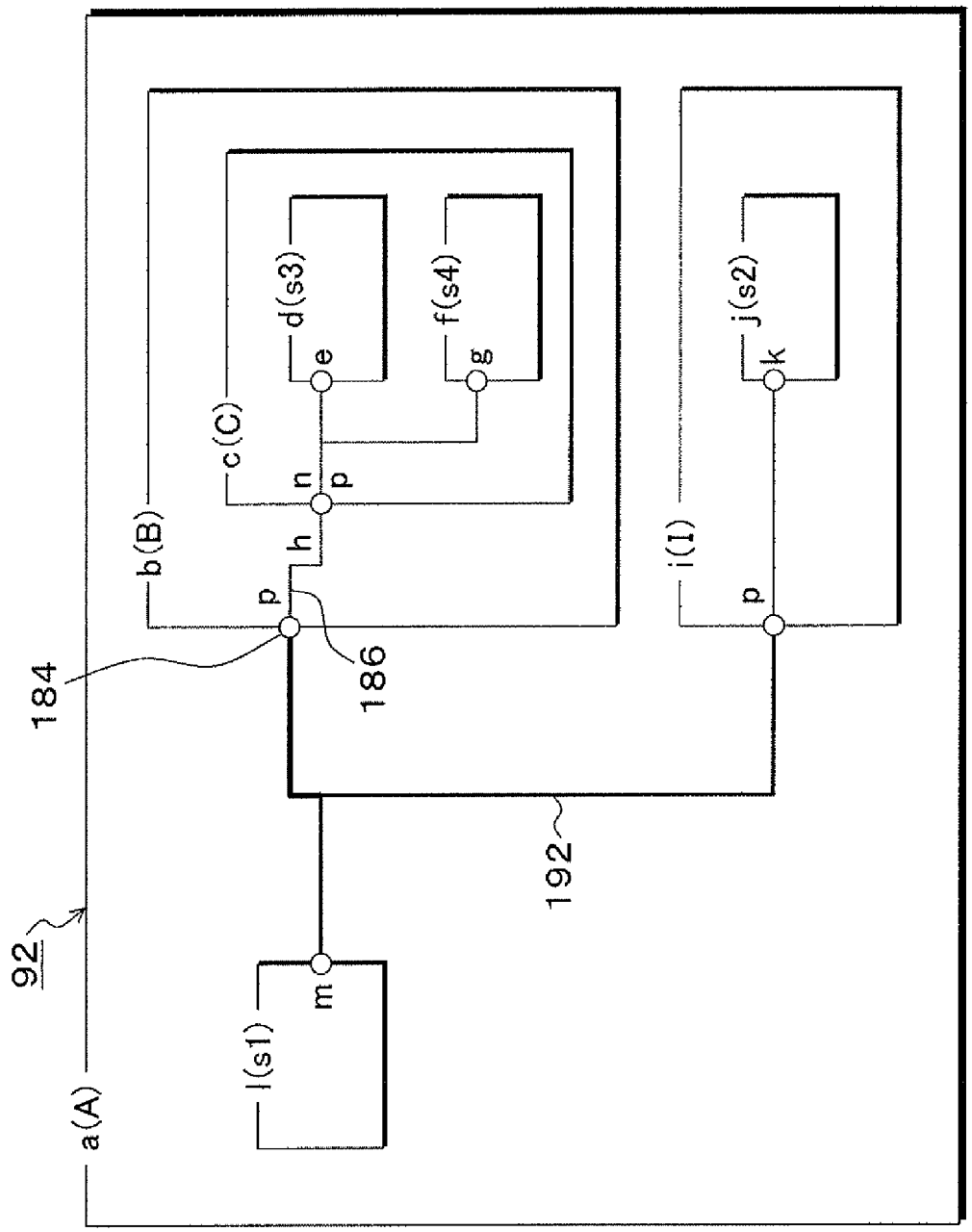
FIG. 23 is a block diagram of a logic circuit corresponding to the connection processing in the tree structure in FIG. 22.
Figure 24:
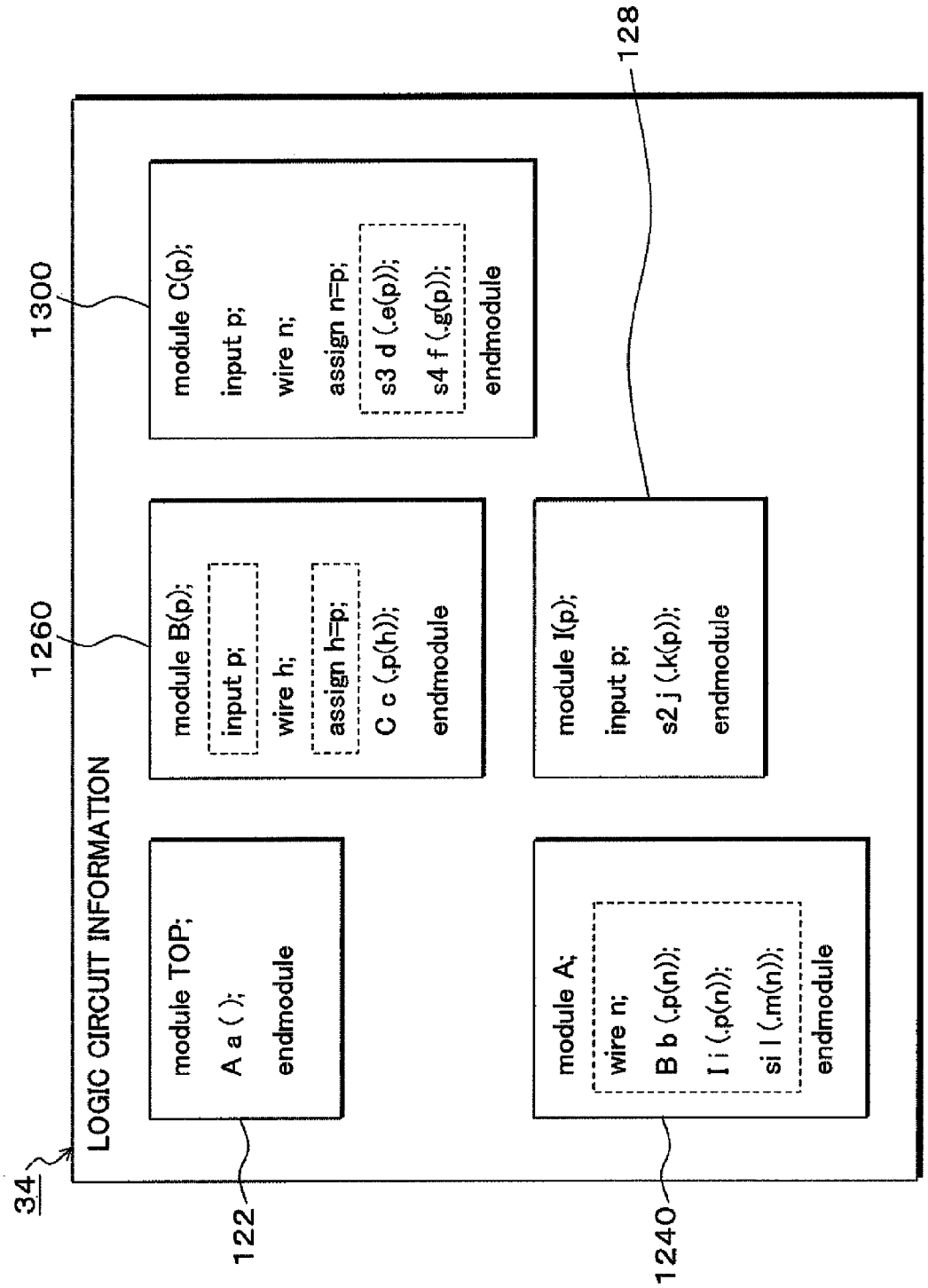
FIG. 24 is an explanatory diagram of logic circuit information rewritten and outputted by the connection processing performed up to FIG. 23.

Further, via the tree structures for the rewriting processing shown in FIG. 14 and FIG. 15, finally, the connection shown in the logic circuit 92 in FIG. 23 is terminated at a processing the processing target of which is the node 154 which is the uppermost node 172, and the logic circuit information 34 in FIG. 24 which has been rewritten is read out from the logic circuit 92 in which the connection processing has been terminated, and outputted outside.

With respect to the logic circuit information 34 in FIG. 24 which has been rewritten by the connection processing, as being apparent from comparison with the logic circuit information 12 read in FIG. 19, it can be found that the module information 122, 128 has stayed the same but the module information 124, 126, 130 have been rewritten as regions of the module information 1240, 1260, 1300 surrounded by broken lines.

Figure 25:
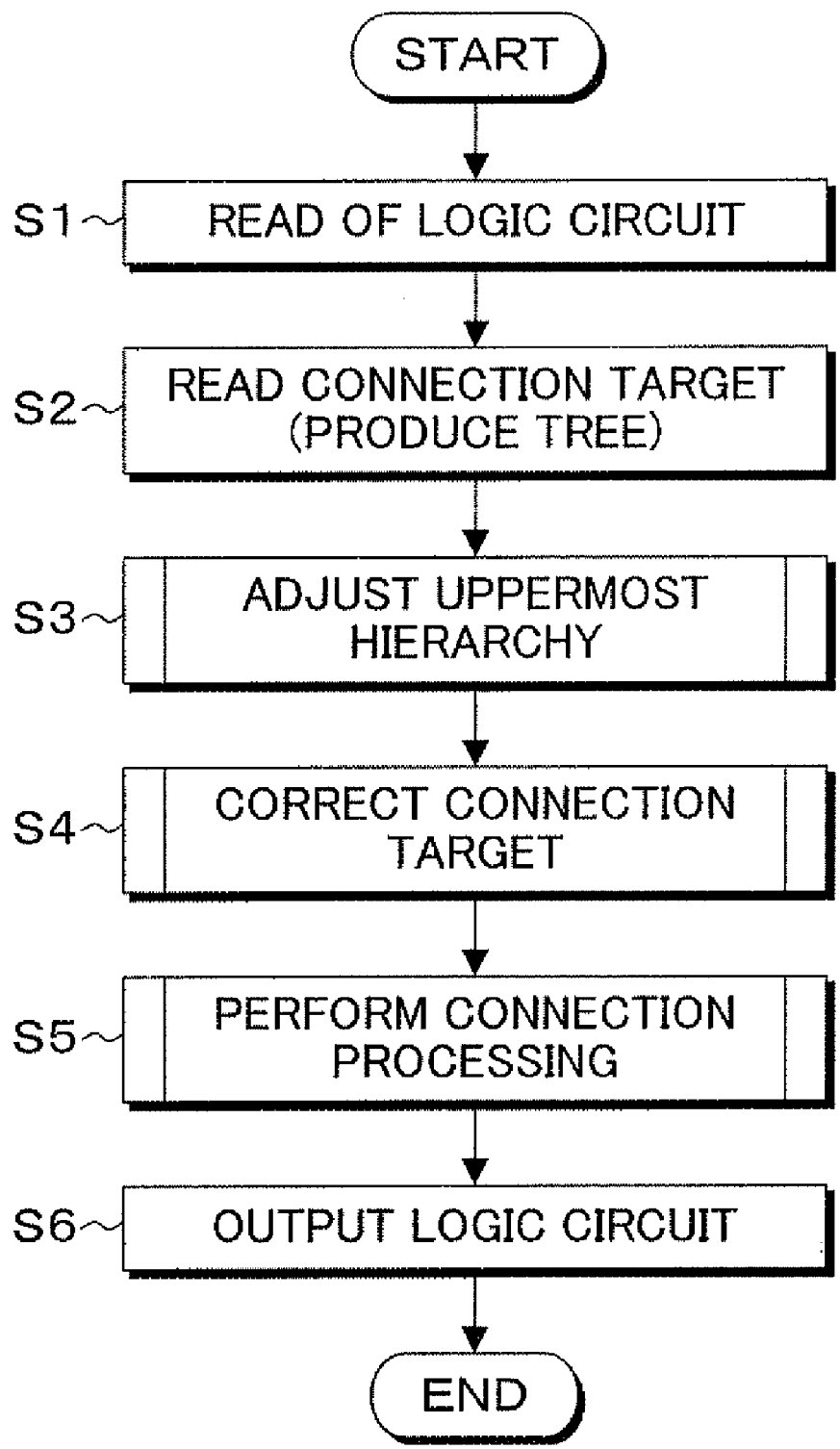
FIG. 25 is a flowchart of an overall hierarchy connection processing according to the present invention.

FIG. 25 is a flowchart of an overall connection processing of a hierarchical logic circuit performed by the logic circuit designing device 10 in FIG. 1. In FIG. 25, the logic circuit reading unit 18 reads the logic circuit information 12 and processing information of the library 14 at step S1, and stores them in the logic circuit storing unit 20. Subsequently, at step S2, the connection target reading unit 22 reads the connection target information 16, and produces a tree structure and stores the same in the connection target storing unit 24. Subsequently, at step S3, the tree structure is searched from the top node, and adjustment is performed such that a node from which the tree branches is a node of the uppermost hierarchy. Subsequently, at step S4, a hierarchy port to which a net has been connected is searched, and a correcting processing of adding a leaf for using a hierarchy port for connection is performed. Then, at step S5, a connection processing for each node is performed from bottom up regarding the tree structure, the logic circuit information stored is rewritten, and the logic circuit information is finally outputted outside at step S6.

Figure 26:
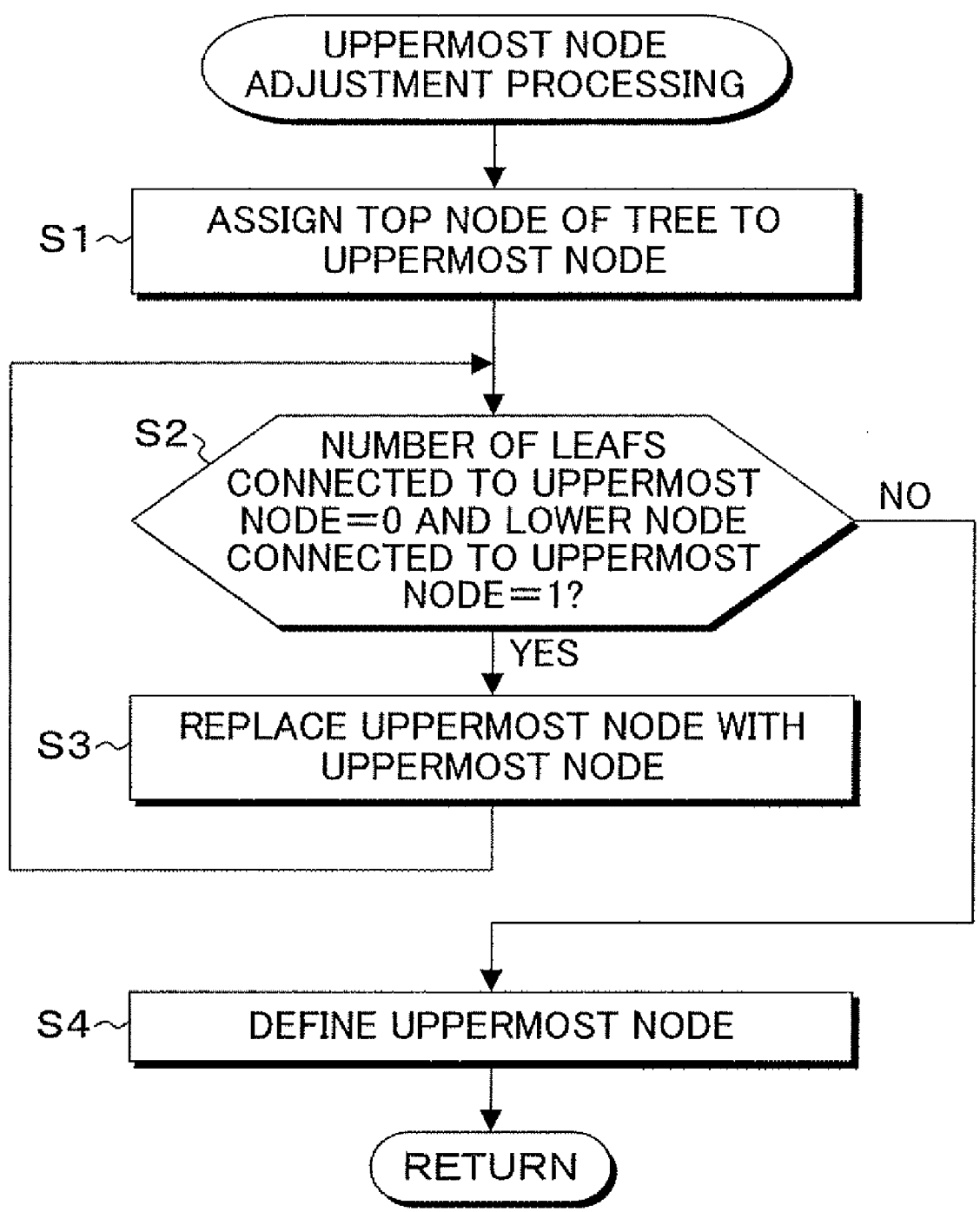
FIG. 26 is a flowchart showing details of an uppermost hierarchy adjustment processing at step S3 in FIG. 25.

FIG. 26 is a flowchart showing details of the uppermost hierarchy adjustment processing at step S3 in FIG. 25, and to take the tree structure in FIG. 10 as an example, the uppermost hierarchy adjustment processing is explained in following manner. First, at step S1, the top node 152 of the tree structure is assigned to an uppermost node. Subsequently, at step S2, whether or not the number of leaves which have been connected to the uppermost node is 0 and the number of lower nodes which have been connected to the uppermost node is 1 are checked. Since this condition is satisfied in the case of the node 152, it is determined that the node 152 is not the uppermost node, the processing proceeds to step S3 where the uppermost node is replaced with the lower node 154. Subsequently, at step S2, the lower node 154 with which the uppermost node has been replaced is regarded as an uppermost node, and whether or not the number of leaves which have been connected to the uppermost node is 0 and the number of lower nodes which have been connected to the uppermost node is 1 is determined. Since one leaf 162 and two nodes 156, 158 are connected to the node 154, the processing proceeds to step S4 where the node 154 is defined as an uppermost node.

Figure 27:
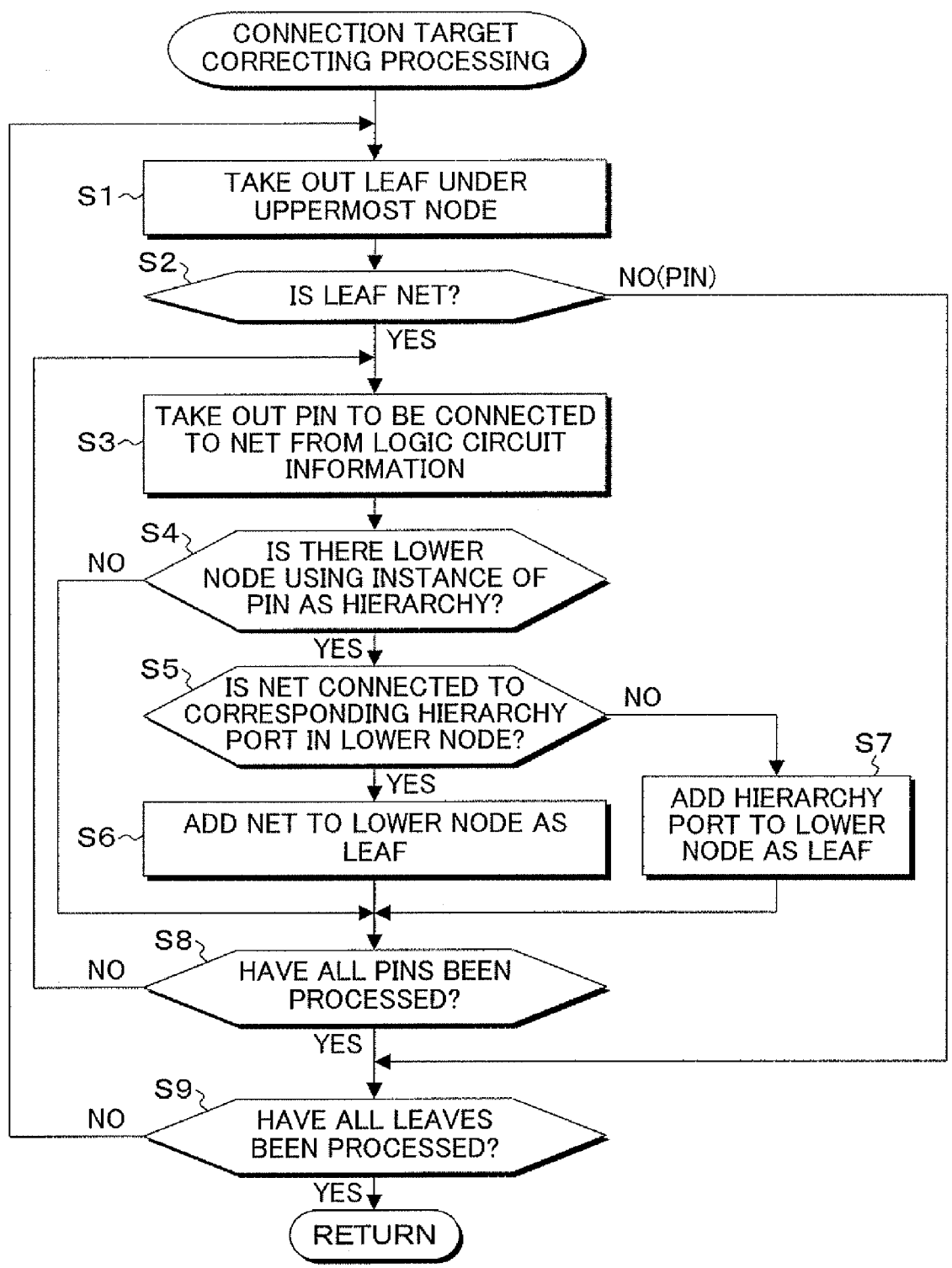
FIG. 27 is a flowchart showing details of a connection target correcting processing at step S4 in FIG. 25.
Figure 28A:
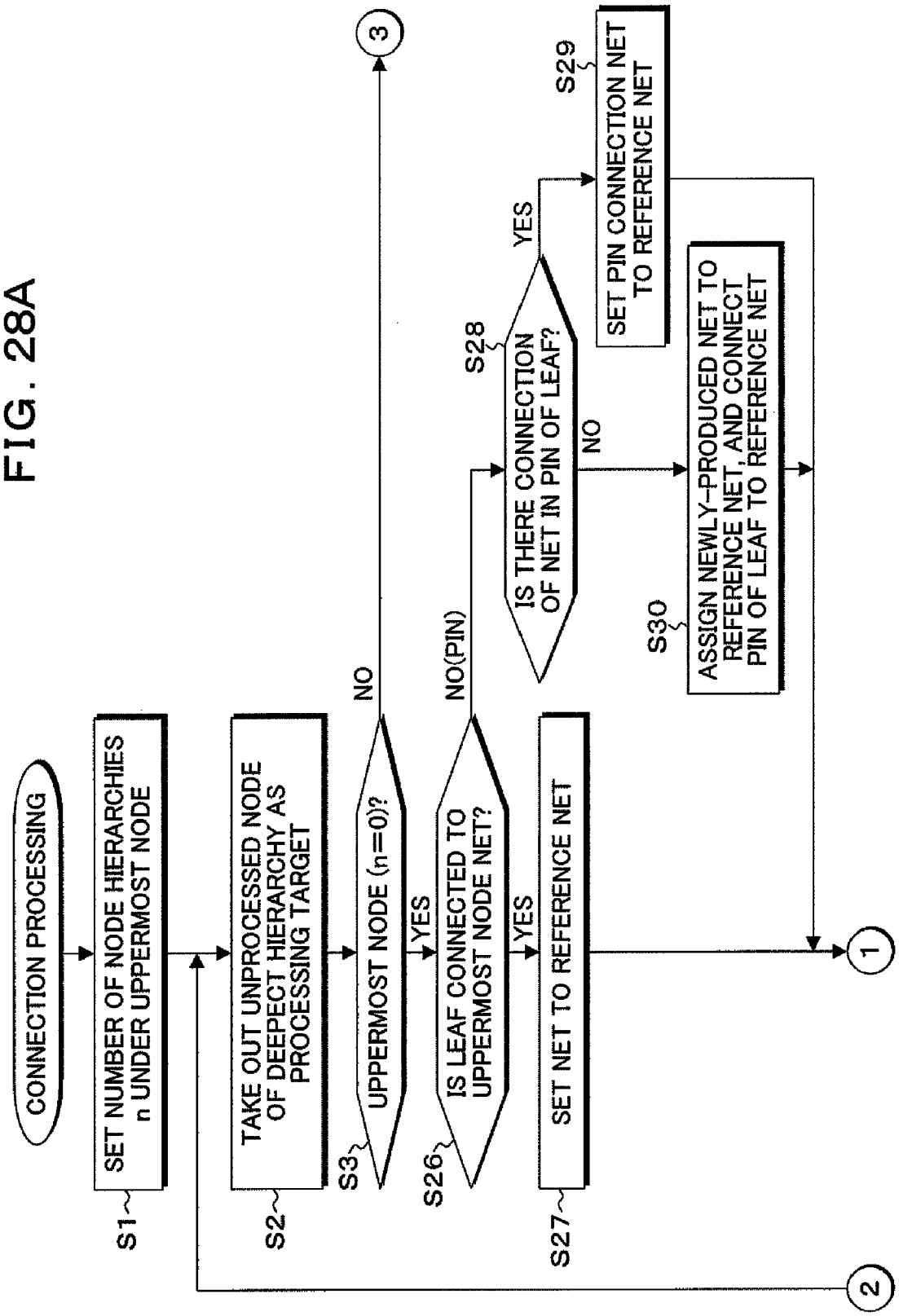
FIGS. 28A and 28B are flowcharts showing details of a connection processing at step S5 in FIG. 25.
Figure 28B:
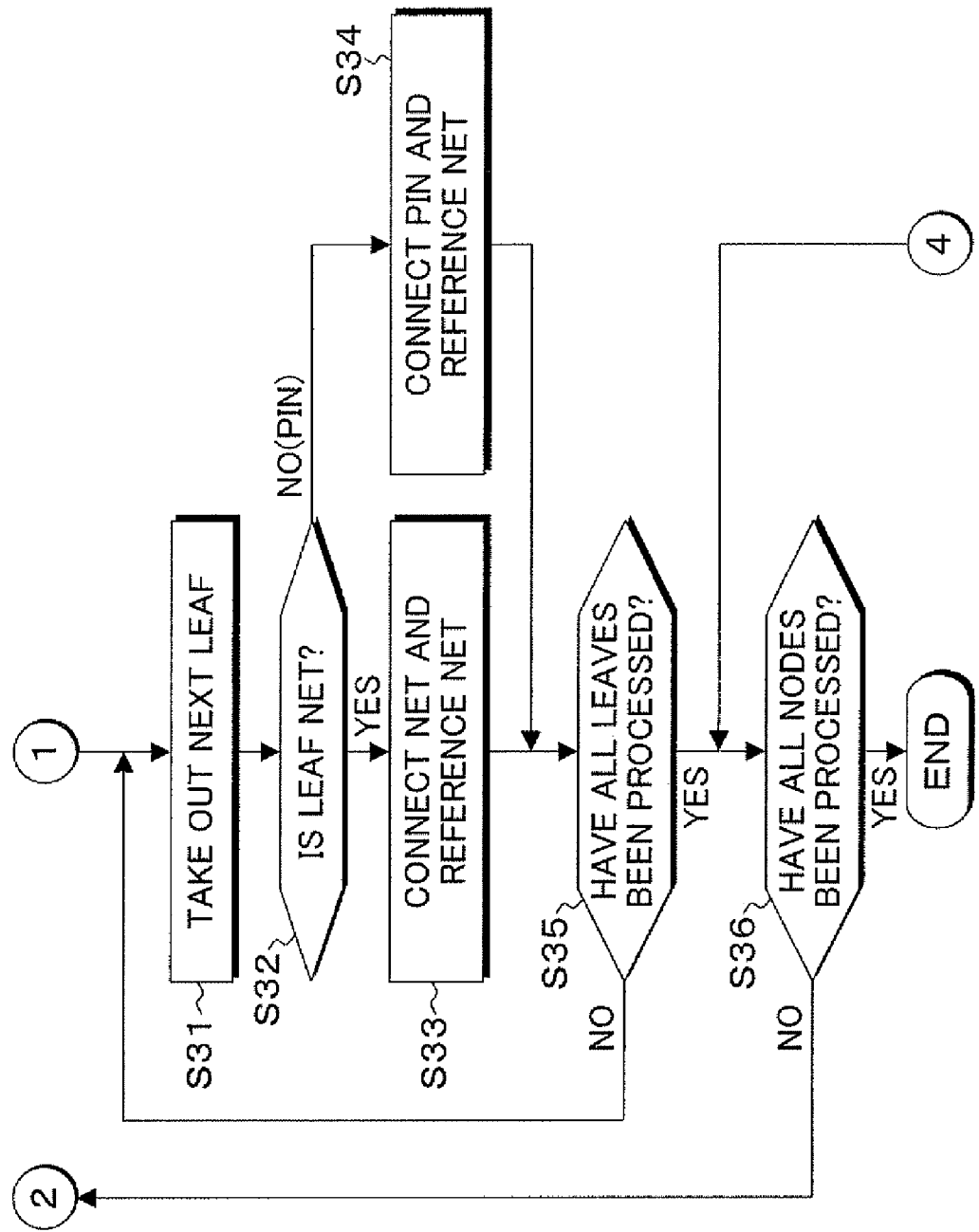

FIG. 27 is a flowchart showing details of the connection target correcting processing at step S4 in FIG. 25, and to take the tree structure in FIG. 10 as an example, the connection target correcting processing is explained in the following manner. First, at step S1, a leaf under the node 154 which is the uppermost node 172 is taken out. As this leaf, for example, the leaf 170 positioned in n=3 showing the depth is taken out, since the deepest-first search has been adopted in the present embodiment. At step S2, whether or not a connection target of the leaf 170 is a net is determined, and since the connection target is the pin "g" in this case, the processing proceeds to step S9, where whether or not all leaves have been processed is checked, and since all leaves have not been processed, the processing returns to step S1 and the next leaf 168 is taken out. When such a leaf taking-out processing is repeated and the leaf 164 is taken out, it is determined at step S2 that the leaf 164 is the net "h". In this case, the processing proceeds to step S3, and the pin "p" connected to the net "h" is taken out from the logic circuit information, namely, the information on the logic circuit 92 shown in FIG. 5. Next, at step S4, whether or not a lower node where the instance "c" of the net "h" is taken as the hierarchy is checked. Since the lower node 160 exists in this case, whether or not a net in the hierarchy is connected to the corresponding hierarchy port "p" in the lower node 160 is determined. Since the net in the hierarchy 96 is not connected to the hierarchy port "p" in the case of the logic circuit 92 in FIG. 5, the processing proceeds to step S7 where the leaf 174 of the hierarchy port "p" is added to the lower-node 160. On the other hand, in the logic circuit 92 shown in FIG. 18, since the corresponding hierarchy port "p" is connected with the net "n" in the node in the lower node, the processing proceeds to step S6, and in this case, as shown in the tree structure in FIG. 20, the leaf 198 of the net "n" is added to the lower node 160. Subsequently, the processing proceeds to step S8 where whether or not all pins have been processed is checked, and if all pins have been processed, whether or not all leaves have been processed is checked at step S9, and since there is only one leaf of a net in the case of FIG. 10, a series of the processings are terminated and the procedure returns to the main routine in FIG. 25.

Figure 29:
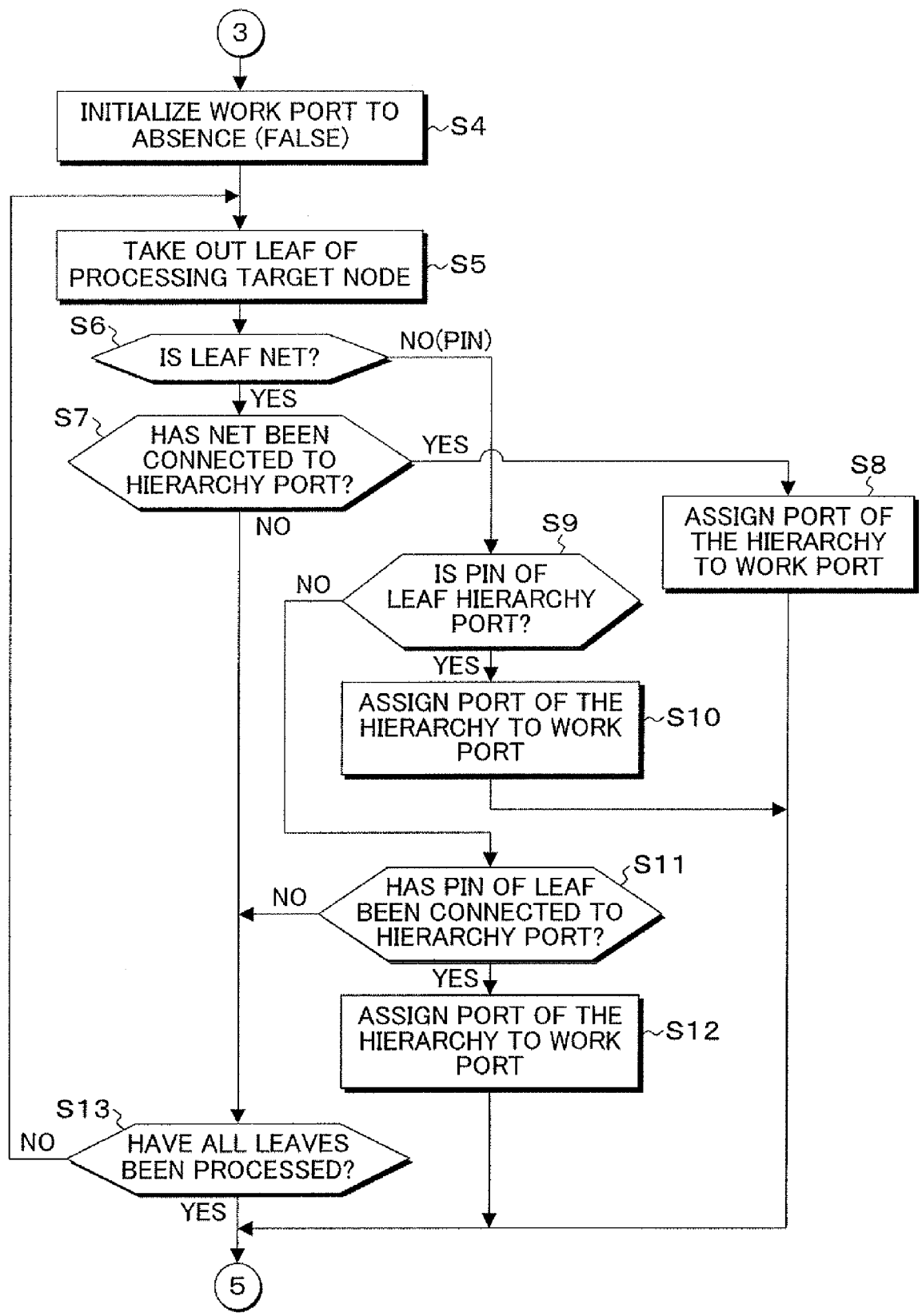
FIG. 29 is a flowchart of a connection processing subsequent to FIGS. 28A and 28B.
Figure 30:
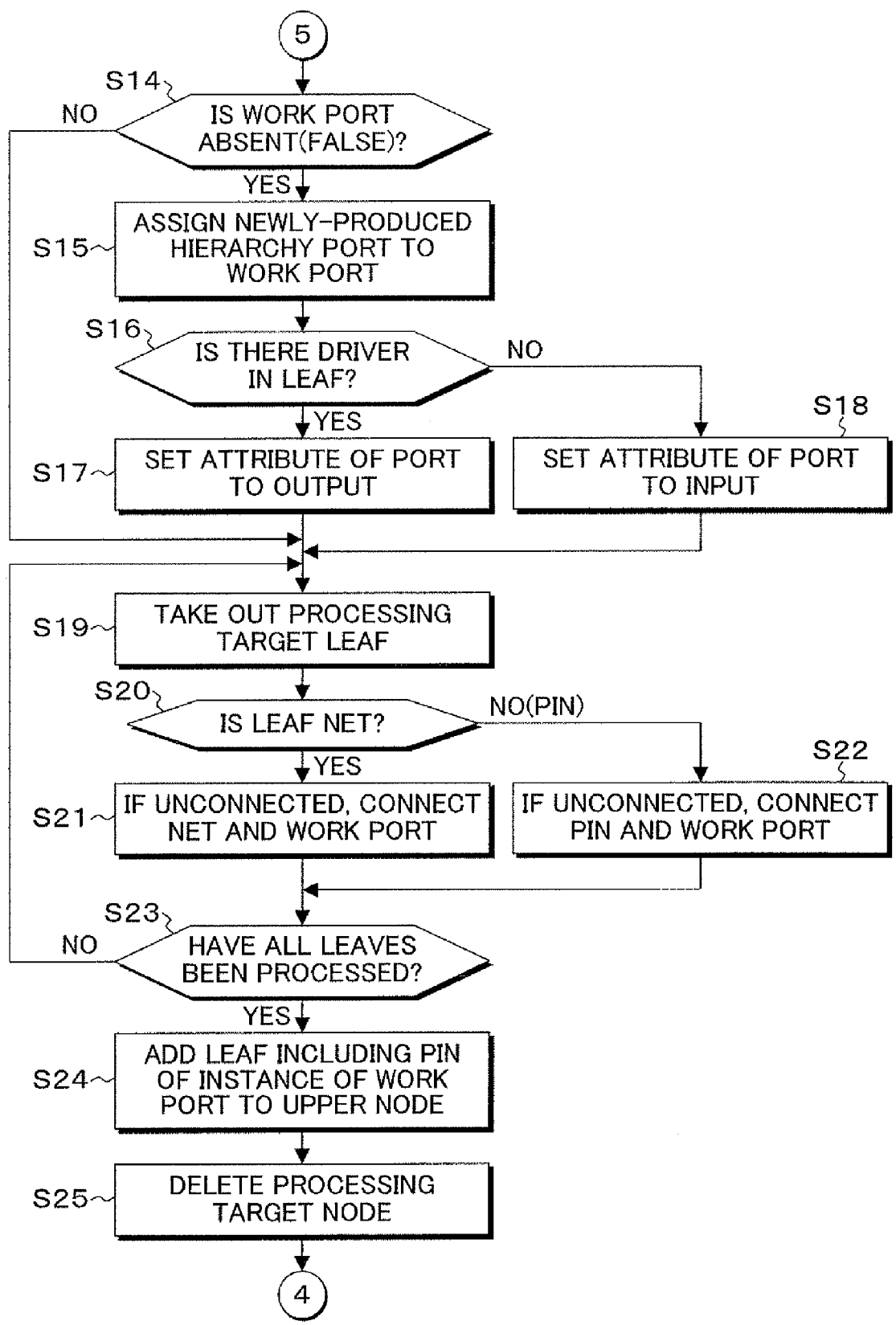
FIG. 30 is a flowchart of a connection processing subsequent to FIGS. 28A and 28B.
Figure 31:
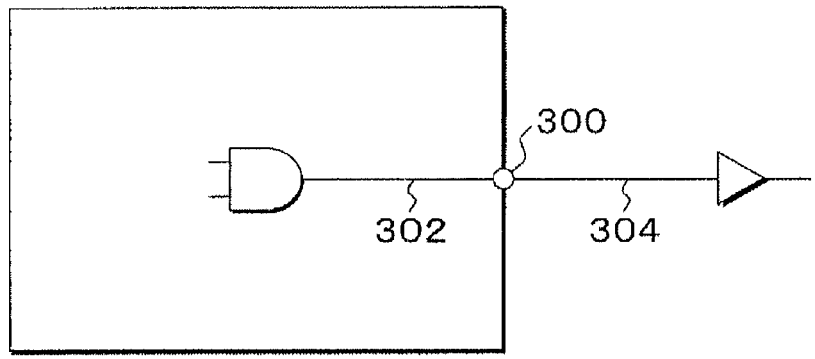
FIG. 31 is an explanatory diagram of conventional signal connection between hierarchies.
Figure 32:
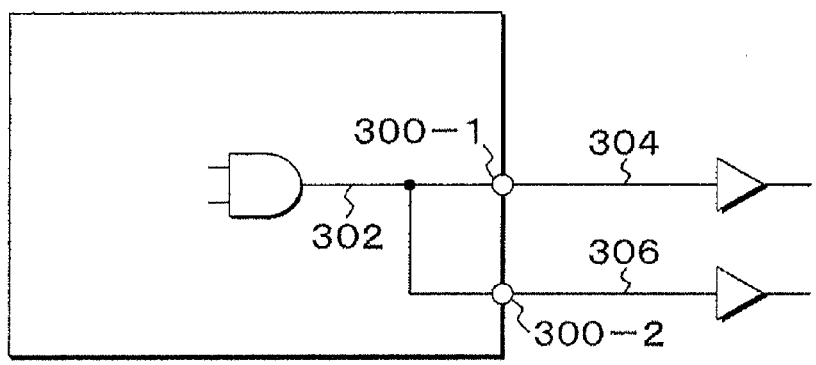
FIG. 32 is explanatory diagram of a problem that a plurality of hierarchy ports is produced by a conventional technique.
Figure 33:
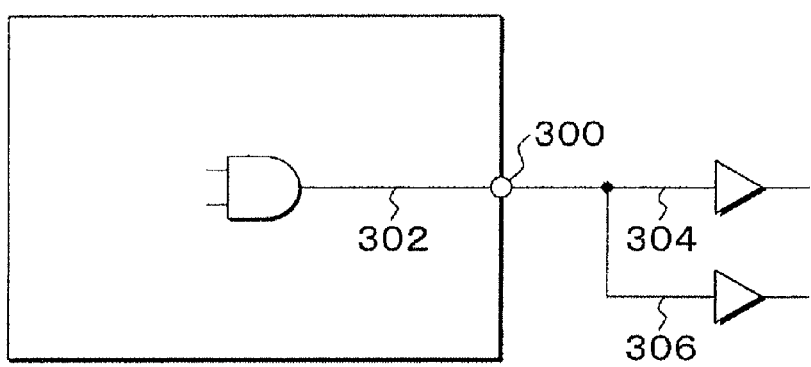
FIG. 33 is explanatory diagram of a problem that a plurality of hierarchy ports is produced by a conventional technique.

FIGS. 28A and 28B, FIG. 29, FIG. 30 are flowcharts showing details of a connection processing at step S5 in FIG. 25, and to take the tree structure in FIG. 10 as an example, the connection processing is explained in following manner. First, at step S1, the number n of hierarchies is set in the nodes under the node 154 which is the uppermost node 172. Next, at step S2, an unprocessed node in the deepest hierarchy is taken out as a processing target. In this case, the node 160 of n=2 is taken out. Subsequently, at step S3, whether or not the node 160 is the uppermost node is determined, and since the node 160 is not the uppermost node, the processing proceeds to step S4 in FIG. 29. The processings at steps S4 to S13 in FIG. 29 are a processing for searching a hierarchy port from the tree structure. First, after a work port is initialized to false at step S4, one of the leaves 168, 170, 174 of the processing target node 160, for example, the leaf 168 is taken out at step S5. Next, at step S6, whether or not the leaf 168 is a net is determined. In this case, since the leaf 168 is the pin "e", the processing proceeds to step S9. At step S9, whether or not the pin of the leaf 168 is a hierarchy port is checked. Since the pin "e" is not a hierarchy port as understood from the logic circuit 92 in FIG. 5, the processing proceeds to step S11 where whether or not the pin "e" has been connected to a hierarchy port is checked. Since the pin "e" has not been connected to a hierarchy port in this case, the processing proceeds to step S13, and since all leaves have not been processed, the processing returns to step S5 and a next leaf 170 is taken out. Since the leaf 170 is also the pin "g", the leaf 170 is subjected to the same processing as that to the leaf 168. Next, the leaf 174 is taken out, and since the leaf 174 is the hierarchy port "p", it is determined at step S9 that the pin "p" of the leaf 174 is a hierarchy port, and the pin "p" is assigned to the work port at step S10. The connection processing further proceeds, and in a search processing of a hierarchy port in a case in which the node 156 is taken as a processing target in the tree structure in FIG. 12, when the leaf 164 is taken out at step S5, it is determined at step S6 that the leaf 164 is the net "h", and in this case, whether or not the net "h" is connected to a hierarchy port at step S7 is determined, and since the net h is connected to the hierarchy port "p" as shown in the logic circuit 92 in FIG. 11, the pin "p" is assigned to the work port at step S8. According to steps S4 to S13 in FIG. 29, the existence of a hierarchy port in the tree structure is searched. Subsequently, the processing proceeds to step S14 in FIG. 30. The processings at step S14 to S18 in FIG. 30 are a processing for producing a hierarchy port newly when a hierarchy port does not exist. At step S14, whether or not the work port is false, namely, whether or not a hierarchy port has not been searched at the processings at steps S4 to S13 in FIG. 29 is determined, and when the work port is false, namely, when a hierarchy port has not been searched, a hierarchy port newly produced is assigned to the work port at step S15. Then, at step S16, whether or not a driver exists in a leaf is determined, and if a driver exists, the attribute of the hierarchy port newly produced is set to an output attribute at step S17, and if a driver does not exist, the attribute of the hierarchy port is set to an input attribute at step S18. If the above search of a hierarchy port or the above novel production at a case in which a hierarchy port does not exist has been completed, for example, the leaf 168 in the processing target node 160 in FIG. 10 is taken out at step S19, and whether or not the leaf is a net is checked at step S20, and since the leaf is the pin "e" in this case, the processing proceeds to step S22, and if the pin "e" and the work port have not been connected, the pin "e" and the work port are connected. On the other hand, when the leaf is a net at step S20, the processing proceeds to step S21, and if the net and the work port have not been connected, the net and the work port are connected. The processings at steps S19 to S22 are repeated with respect to all leaves 168, 170, 174 of the processing target node 160 at step S23. When the processing of all leaves of the processing target node 160 have been completed at step S23, a leaf having the pin "p" of the instance of the work port is added to the upper node 156 at step S24 as in the case of the leaf 182 of the tree structure in FIG. 12, and the node 160 in FIG. 10 which is currently a processing target is deleted at step S25. Subsequently, the processing returns to step S36 in FIGS. 28A and 28B, and whether or not all nodes have been processed is checked. Since all nodes have not been processed, the processing proceeds to step S2 where a node in the next hierarchy n=1 is taken out, and similar processing is repeated. Through such bottom-up processing for each node, the connection processing proceeds to the hierarchical structure in FIG. 15 at step S3, and when the node 154 is taken out, it is determined at step S3 that the node 154 is the uppermost node, and the processing proceeds to step S26. At step S26, one of leaves connected to the uppermost node 154, for example, the leaf 188 is taken out, and whether or not the leaf 188 is a net is determined.

Since the leaf 188 is a pin in this case, the processing proceeds to step S28, and whether or not the pin of the leaf 188 has been connected with a net is determined. Since the pin "p" has not been connected with a net as understood from the logic circuit 92 in FIG. 13 in this case, the processing proceeds to step S30, a newly-produced net is assigned to the reference net, and the pin "p" of the leaf 188 is connected to the reference net. That is, as in the case of the logic circuit 92 in FIG. 16, the reference net 192 is newly produced, and connected with the pin "p". On the other hand, when the leaf connected to the uppermost node is a net at step S26, the net is set to the reference net at step S27. Further, when the pin of the leaf has been connected with a net at step S28, the net connected with the pin is set to the reference net at step S29. The processings at steps S26 to S30 are a processing of a first-taken-out leaf of a plurality of leaves connected to the uppermost node. Then, at step S31, a next leaf, namely, a second leaf 190 is taken out, and whether or not the leaf is a net is determined at step S32, and since the leaf 190 is the pin "p" in this case, the pin "p" and the reference net are connected at step S34. If the leaf is a net at step S32, the net and the reference net are connected at step S33. Thereafter, with respect to the remaining leaves, the processing for connecting a pin or a net to a reference net is repeated according to the processings at step S31 to step S34, until all leaves have been processed at step S35. When the processing has been completed at step S35, it is determined that all node have been processed based upon the fact that the processing with respect to the uppermost node has been terminated at step S36, and a series of the connection processings is terminated.

Such a processing procedure shown in the flowcharts in FIG. 25 to FIG. 30 shows the content of the signal connection processing program of a hierarchical logic circuit according to the present invention.

Further, the present invention provides a computer-readable recording medium storing a signal processing program of a hierarchical logic circuit. This recording medium includes a portable recoding medium such as a CD-ROM, a Floppy Disk®, a DVD disk, a magnet-optical disk, or an IC card, or a recording medium such as a hard disk drive provided inside or outside a computer system, and besides, a database for holding a program via a line, another computer system and a database thereof, and further, a transmission medium on a line.

Further, the present invention includes a proper modification which does not impair the object and the advantages thereof, and further, is not limited by a numerical value shown in the above embodiment.

The invention claimed is:

1. A non-transitory computer-readable medium which stores a signal connection program of a hierarchical logic circuit, causing a computer to execute:
   a logic circuit reading step of reading information on a logic circuit having a hierarchical structure;
   a connection target reading step of reading connection target information up to a connection target including a pin or a net via hierarchies of the logic circuit, and producing a tree structure in which a hierarchy is taken as a node and a connection target is taken as a leaf;
   an uppermost hierarchy adjusting step of referring to the tree structure from its root, and taking a node from which the tree branches as an uppermost node;
   a connection target correcting step of searching a leaf the connection target of which is taken as a net from the tree structure, and adding a hierarchy port or a net in a lower hierarchy as a leaf to a lower hierarchy node connected to the net via the hierarchy port;

a connection processing step of performing a connection processing from bottom up to the tree structure and rewriting the logic circuit information; and a logic circuit outputting step of outputting logic circuit information in which the connection processing has been completed.

2. The medium according to claim 1, wherein the uppermost hierarchy adjusting step:

takes out a node of the tree structure from its root and sets the node as a processing target, and sets a lower node as a next processing target node when the number of leaves of the processing target node is zero and the number of lower nodes is one, and sets the processing target node as an uppermost node when the number of leaves of the processing target node is one or more or the number of lower nodes is two or more.

3. The medium according to claim 1, wherein the connection target correcting step executes:

a leaf searching step of searching a leaf the connection target of which is taken as a net from the tree structure;

a pin searching step of searching a pin to be connected to the net; and a leaf adding step of, when the pin has been searched, searching a lower node where an instance of the pin is taken as a hierarchy, and when the lower node has been searched, (1) in the lower hierarchy node, when a hierarchy port corresponding to the pin has not been connected with a net of the lower hierarchy node, adding the hierarchy port as a leaf of the lower hierarchy node, and (2) when a hierarchy port corresponding to the pin has been connected with a net of the lower hierarchy node, adding the net as a leaf of the lower hierarchy node.

4. The medium according to claim 1, wherein the connection processing step executes:

when a processing target node is not an uppermost node, a hierarchy port producing step of determining whether or not a leaf of the processing target node is a hierarchy port or whether or not the leaf is connected with a hierarchy port at a net, and when a hierarchy port exists, setting the hierarchy port as a connection target, and when a hierarchy port does not exist, producing a hierarchy port newly;

an input/output attribute setting step of setting an input/output attribute to an output attribute if a driver exists in at least one leaf of the target node, and setting the input/output attribute to an input attribute if a driver does not exist;

a connecting step of connecting a leaf of the target node with the hierarchy port;

a connection correcting step of adding the hierarchy port as a leaf to an upper hierarchy node; and an updating step of deleting the processing target node and setting a next node as a processing target node, and executes, when a processing target node is an uppermost node, a reference net setting step of, if a first processing target leaf is a net, setting the net as a reference net, if a first processing target leaf is a hierarchy port or a pin, setting the hierarchy port or a net connected to a pin as a reference net, and if connection of a net does not exist, producing a net newly and connecting the same to set the same as a reference net; and a connecting step of connecting processing target leafs subsequent to the second processing target leaf with the reference net.

5. A signal connection method of a hierarchical logic circuit by causing a computer to execute, comprising:

a logic circuit reading step of reading information on a logic circuit having a hierarchical structure;

a connection target reading step of reading connection target information up to a connection target including a pin or a net via hierarchies of the logic circuit, and producing a tree structure in which a hierarchy is taken as a node and a connection target is taken as a leaf;

an uppermost hierarchy adjusting step of referring to the tree structure from its root, and setting a node from which the tree branches as an uppermost node;

a connection target correcting step of searching a leaf the connection target of which is taken as a net from the tree structure, and adding a hierarchy port or a net in a lower hierarchy as a leaf to a lower hierarchy node connected to the net via the hierarchy port;

a connection processing step, performed by the computer, of performing a connection processing from bottom up to the tree structure and rewriting the logic circuit information; and a logic circuit outputting step of outputting logic circuit information in which the connection processing has been completed.

6. The signal connection method of a hierarchical logic circuit according to claim 5, wherein the uppermost hierarchy adjusting step;

takes out a node of the tree structure from its root and sets the node as a processing target, and sets a lower node as a next processing target node when the number of leaves of the processing target node is zero and the number of lower nodes is one, and sets the processing target node to an uppermost node when the number of leaves of the processing target node is one or more or the number of lower nodes is two or more.

7. The signal connection method of a hierarchical logic circuit according to claim 5, wherein the connection target correcting step executes:

a leaf searching step of searching a leaf the connection target of which is a net from the tree structure;

a pin searching step of searching a pin to be connected to the net; and a leaf adding step of, when the pin has been searched, searching a lower node where an instance of the pin is taken as a hierarchy, and when the lower node has been searched, (1) in the lower hierarchy node, when a hierarchy port corresponding to the pin has not been connected with a net of the lower hierarchy node, adding the hierarchy port as a leaf of the lower hierarchy node, and (2) when a hierarchy port corresponding to the pin is connected with a net of the lower hierarchy node, adding the net as a leaf of the lower hierarchy node.

8. The signal connection method of a hierarchical logic circuit according to claim 5, wherein the connection processing step executes:

when a processing target node is not an uppermost node, a hierarchy port producing step of determining whether or not a leaf of the processing target node is a hierarchy port or whether or not the leaf is connected to a hierarchy port by a net, and when a hierarchy port exists, setting the hierarchy port as a connection target, and when a hierarchy port does not exist, producing a hierarchy port newly;

an input/output attribute setting step of setting an input/output attribute to an output attribute if a driver exists in at least one leaf of the target node, and setting the input/output attribute to an input attribute if a driver does not exist;

a connecting step of connecting a leaf of the target node with the hierarchy port;

a connection correcting step of adding the hierarchy port as a leaf to an upper hierarchy node; and an updating step of deleting the processing target node and setting a next node as a processing target node, and executes, when a processing target node is an uppermost node, a reference net setting step of, if a first processing target node is a net, setting a net as a reference net, and if a first processing target leaf is a hierarchy port or a pin, setting the hierarchy port or a net connected to a pin as a reference net, and if connection of a net does not exist, producing a net newly and connecting to set the same as a reference net; and a connecting step of connecting processing target leafs subsequent to the second processing target leaf with the reference net.

9. A logic circuit designing device, comprising:

a logic circuit reading unit for reading information on a logic circuit having a hierarchical structure;

a connection target reading unit for reading connection target information of the logic circuit, and producing a tree structure in which a hierarchy is taken as a node and a connection target is taken as a leaf;

an uppermost hierarchy adjusting unit for referring to the tree structure, and setting a node from which the tree branches as an uppermost node;

a connection target correcting unit for searching a leaf the connection target of which is taken as a net from the tree structure, and adding a hierarchy port or a net in a lower hierarchy as a leaf to a lower hierarchy node connected to the net via the hierarchy port;

a connection processing unit for performing a connection processing to the tree structure and rewriting the logic circuit information; and a logic circuit outputting unit for outputting logic circuit information in which the connection processing has been completed.

10. The logic circuit designing device according to claim 9, wherein the uppermost hierarchy adjusting unit takes out a node of the tree structure from its root and sets the node to a processing target, and sets a lower node as a next processing target node when the number of leaves of the processing target node is zero and the number of lower nodes is one, and sets the processing target node as an uppermost node when the number of leaves of the processing target node is one or more or the number of lower nodes is two or more.

11. The logic circuit designing device according to claim 9, wherein the connection target correcting unit:

searches a leaf the connection target of which is taken as a net from the tree structure;

searches a pin to be connected to the net; and when the pin has been searched, searches a lower node where an instance of the pin is taken as a hierarchy, and when the lower node has been searched, (1) in the lower hierarchy node, when a hierarchy port corresponding to the pin has not been connected with a net of the lower hierarchy node, adds the hierarchy port as a leaf of the lower hierarchy node, and (2) when a hierarchy port corresponding to the pin is connected with a net of the lower hierarchy node, adds the net as a leaf of the lower hierarchy node.

12. The logic circuit designing device according to claim 9, wherein the connection processing unit:

when a processing target node is not an uppermost node, determines whether or not a leaf of the processing target node is a hierarchy port or whether or not the leaf is connected to a hierarchy port by a net, and when a hierarchy port exists, sets the hierarchy port as a connection target, and when a hierarchy port does not exist, produces a hierarchy port newly;

sets an input/output attribute to an output attribute if a driver exists in at least one leaf of the target node, and sets the input/output attribute to an input attribute if a driver does not exist;

connects a leaf of the target node with the hierarchy port;

adds the hierarchy port as a leaf to an upper hierarchy node; and deletes the processing target node and sets a next node as a processing target node, and when a processing target node is an uppermost node, if a first processing target leaf is a net, sets the net as a reference net, if a first processing target leaf is a hierarchy port or a pin, sets the hierarchy port or a net connected to a pin as a reference net, and if connection of a net does not exist, produces a net newly and connects the same to set as a reference net; and connects processing target leafs subsequent to the second processing target leaf with the reference net.

* * * * *

UNITED STATES PATENT AND TRADEMARK OFFICE
CERTIFICATE OF CORRECTION

PATENT NO. : 7,840,930 B2  
APPLICATION NO. : 12/102462  
DATED : November 23, 2010  
INVENTOR(S) : Eiji Furukawa Page 1 of 1

It is certified that error appears in the above-identified patent and that said Letters Patent is hereby corrected as shown below:

Cover Page  
Item (63) Related U.S. Application Data  
after "Jan. 19, 2007" insert --it being further noted that foreign priority benefit is based upon international Application PCT/JP2006/300811, filed Jan. 20, 2006.--

Col. 15, lines 23-26, delete "a leaf adding step of, when the pin has been searched, searching a lower node where an instance of the pin is taken as a hierachy, and when the lower node has been searched," and insert --a leaf adding step of, when the pin has been search, searching a lower node where an instance
      of the pin is taken as a hierachy, and
      when the lower node has been search.--

Signed and Sealed this  
Twenty-second Day of March, 2011

David J. Kappos  
*Director of the United States Patent and Trademark Office*